United States Patent
Takaki et al.

(10) Patent No.: US 9,237,298 B2
(45) Date of Patent: Jan. 12, 2016

(54) DIGITAL BROADCAST RECEIVING DEVICE AND STATION SELECTION METHOD

(71) Applicant: MITSUBISHI ELECTRIC CORPORATION, Tokyo (JP)

(72) Inventors: Kazuya Takaki, Tokyo (JP); Keiichi Sirasuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/364,632

(22) PCT Filed: Nov. 16, 2012

(86) PCT No.: PCT/JP2012/079729
§ 371 (c)(1),
(2) Date: Jun. 11, 2014

(87) PCT Pub. No.: WO2013/099465
PCT Pub. Date: Jul. 4, 2013

(65) Prior Publication Data
US 2014/0327834 A1 Nov. 6, 2014

(30) Foreign Application Priority Data
Dec. 28, 2011 (JP) .................................. 2011-287627

(51) Int. Cl.
*H04N 5/50* (2006.01)
*H04H 60/32* (2008.01)
(Continued)

(52) U.S. Cl.
CPC ................ *H04N 5/50* (2013.01); *H03J 1/0075* (2013.01); *H04H 60/32* (2013.01); *H04H 60/44* (2013.01);
(Continued)

(58) Field of Classification Search
CPC ......... H04N 1/00; H04N 3/00; H04N 21/462; H04N 21/266; H04N 21/433; H04N 21/4345; H04N 21/4383; H04N 21/4385; H04N 21/44222; H04N 21/4667; H04N 21/8133; H04N 21/44209; H04N 5/38; H04N 7/20; H04N 17/00; H04N 21/658; H04N 5/4401; H04N 5/50
USPC ................. 348/731–733, 725, 726, 570, 569; 725/37–74, 151; 455/101, 158.1, 455/194.1, 161.2, 181.1, 186.1, 212
IPC ....................................................... H04N 5/50
See application file for complete search history.

(56) References Cited

U.S. PATENT DOCUMENTS 5,745,845 A * 4/1998 Suenaga et al. ............ 455/194.1
6,470,136 B1 10/2002 Kohashi
(Continued)

FOREIGN PATENT DOCUMENTS

JP 10-64136 A 3/1998
JP 2001-285101 A 10/2001
(Continued)

*Primary Examiner* — Trang U Tran
(74) *Attorney, Agent, or Firm* — Birch, Stewart, Kolasch & Birch, LLP

(57) ABSTRACT

A digital broadcast receiving device (100) includes: a same broadcast station determination unit (109) that determines that a broadcast station broadcasting programs with the same broadcast times as the broadcast times of programs broadcast by a selected broadcast station in a predetermined interval in program schedules included in broadcast station information stored in a broadcast station information storage unit (108) is the same broadcast station as the selected broadcast station, generates same broadcast station information associating the selected broadcast station with the broadcast station determined to be the same broadcast station, and stores the same broadcast station information in the broadcast station information storage unit (108); and a station selection control unit (107) that, when reception deterioration is detected, controls the broadcast receiving unit (112) so as to switch the broadcast station selection over to a same broadcast station as determined by the same broadcast station determination unit (109) or to a broadcast station indicated by the same broadcast station information stored in the broadcast station information storage unit (108).

24 Claims, 12 Drawing Sheets

(51) Int. Cl.
*H04H 60/44* (2008.01)
*H03J 1/00* (2006.01)
*H04N 21/434* (2011.01)
*H04N 21/438* (2011.01)
*H04N 21/442* (2011.01)
*H04H 20/22* (2008.01)

(52) U.S. Cl.
CPC ....... *H04N 21/4345* (2013.01); *H04N 21/4383* (2013.01); *H04N 21/44209* (2013.01); *H04H 20/22* (2013.01)

(56) References Cited

U.S. PATENT DOCUMENTS

| | | | |
|---|---|---|---|
| 7,369,826 B2 * | 5/2008 | Wildhagen | ................ 455/179.1 |
| 8,421,930 B2 | 4/2013 | Inoo et al. | |
| 8,533,759 B2 | 9/2013 | Yuki et al. | |
| 8,677,421 B2 * | 3/2014 | Shirasuka et al. | .............. 725/62 |

FOREIGN PATENT DOCUMENTS

| | | | |
|---|---|---|---|
| JP | 2004-208187 A | 7/2004 |
| JP | 2005-217681 A | 8/2005 |
| JP | 2006-166071 A | 6/2006 |
| JP | 2006-174208 A | 6/2006 |
| JP | 2006-186701 A | 7/2006 |
| JP | 2007-36815 A | 2/2007 |
| JP | 2007-88673 A | 4/2007 |
| JP | 2007-129627 A | 5/2007 |
| JP | 2007-251480 A | 9/2007 |
| JP | 2008-294744 A | 12/2008 |
| JP | 2011-40858 A | 2/2011 |
| JP | 2011-182057 A | 9/2011 |
| JP | 2011-259074 A | 12/2011 |
| WO | 2009/008179 A1 | 2/2007 |
| WO | WO 2010/116579 A1 | 10/2010 |

* cited by examiner

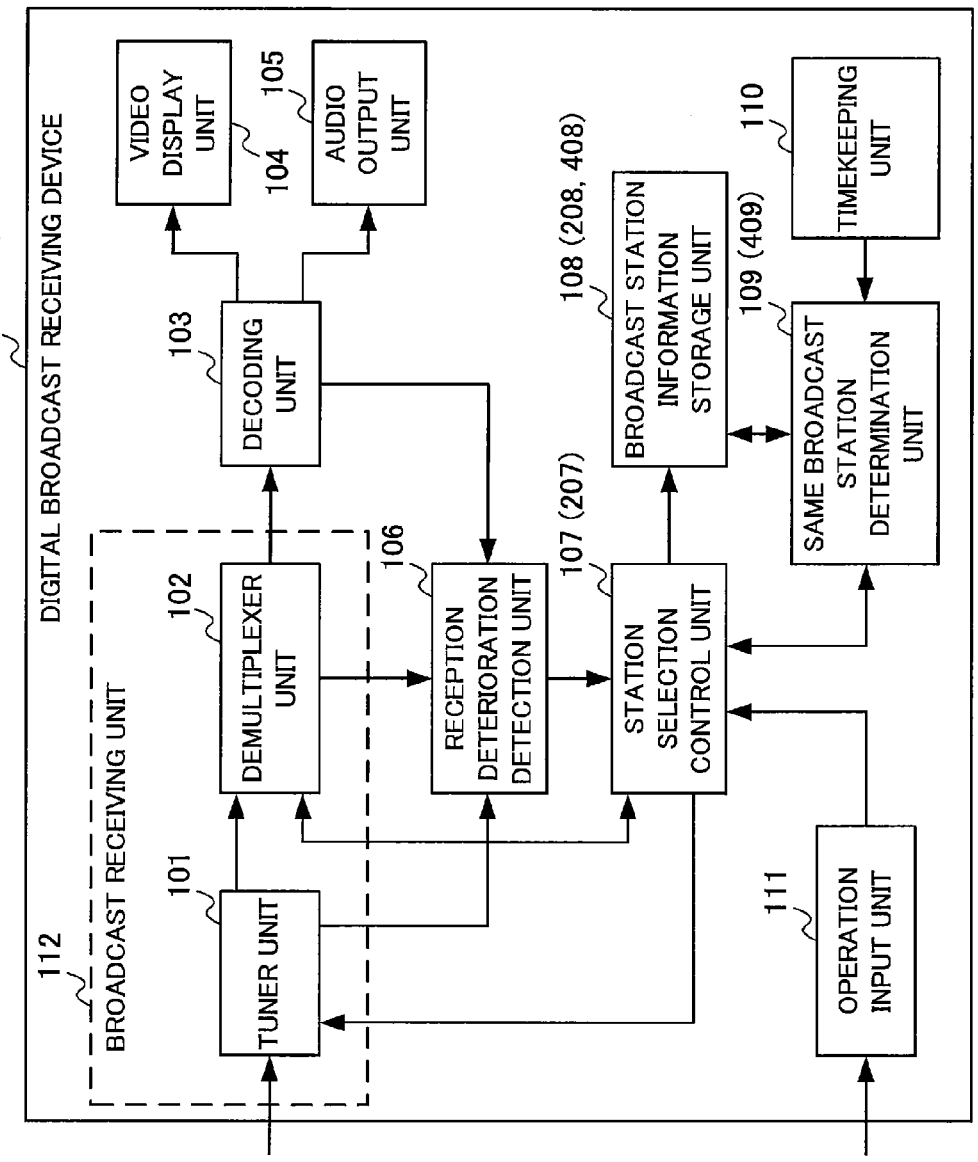

FIG. 2

| BROADCAST STATION 120a | STATION SELECTION INFORMATION 120b | PROGRAM SCHEDULE INFORMATION 120c | | | | |
|---|---|---|---|---|---|---|
| BROADCAST STATION A | PHYSICAL CH$_A$<br>TS_ID$_A$<br>SV_ID$_A$<br>... | (MONTH) (DAY)<br>11:00~12:00<br>NYUUSE_1 | (MONTH) (DAY)<br>12:00~14:00<br>WAIDOSHOU_1 | | (MONTH) (DAY)<br>14:00~15:00<br>RYOURI_1 | ... |
| BROADCAST STATION B | PHYSICAL CH$_B$<br>TS_ID$_B$<br>SV_ID$_B$<br>... | (MONTH) (DAY)<br>11:00~13:00<br>NYUUSE_2 | | (MONTH) (DAY)<br>13:00~14:00<br>DORAMA_2 | (MONTH) (DAY)<br>14:00~15:00<br>NYUUSE_3 | ... |
| BROADCAST STATION C | PHYSICAL CH$_C$<br>TS_ID$_C$<br>SV_ID$_C$<br>... | (MONTH) (DAY)<br>11:00~13:00<br>DORAMA_1 | | (MONTH) (DAY)<br>13:00~14:00<br>SUPOUTSU NYUUSE_1 | (MONTH) (DAY)<br>14:00~15:30<br>ONGAKU_1 | ... |
| ... | ... | ... | | | | |
| BROADCAST STATION F | PHYSICAL CH$_F$<br>TS_ID$_F$<br>SV_ID$_F$<br>... | (MONTH) (DAY)<br>11:00~13:00<br>DRAMA_1 | | (MONTH) (DAY)<br>13:00~14:00<br>SPORTS NEWS_1 | (MONTH) (DAY)<br>14:00~15:30<br>MUSIC_1 | ... |
| ... | | | | | | |

| 221a | 221b |
|---|---|
| BROADCAST STATION | SAME BROADCAST STATION |
| BROADCAST STATION A | BROADCAST STATION K<br>BROADCAST STATION R<br>⋮ |
| BROADCAST STATION B | × |
| BROADCAST STATION C | BROADCAST STATION F |
| ⋮ | ⋮ |
| BROADCAST STATION F | BROADCAST STATION C |
| ⋮ | ⋮ |

FIG. 7

| BROADCAST STATION (220a) | STATION SELECTION INFORMATION (220b) | PROGRAM SCHEDULE INFORMATION (220c) | | | | SAME BROADCAST STATION (220d) |
|---|---|---|---|---|---|---|
| BROADCAST STATION A | PHYSICAL CH$_A$ TS_ID$_A$ SV_ID$_A$ ... | (MONTH) (DAY) 11:00~12:00 NYUUSE_1 | (MONTH) (DAY) 12:00~14:00 WAIDOSHOU_1 | | (MONTH) (DAY) 14:00~15:00 RYOURI_1 | BROADCAST STATION K BROADCAST STATION R ... |
| BROADCAST STATION B | PHYSICAL CH$_B$ TS_ID$_B$ SV_ID$_B$ ... | (MONTH) (DAY) 11:00~13:00 NYUUSE_2 | | (MONTH) (DAY) 13:00~14:00 DORAMA_2 | (MONTH) (DAY) 14:00~15:00 NYUUSE_3 | × |
| BROADCAST STATION C | PHYSICAL CH$_C$ TS_ID$_C$ SV_ID$_C$ ... | (MONTH) (DAY) 11:00~13:00 DORAMA_1 | | (MONTH) (DAY) 13:00~14:00 SUPOUTSU NYUUSE_1 | (MONTH) (DAY) 14:00~15:30 ONGAKU_1 | BROADCAST STATION F ... |
| BROADCAST STATION F | PHYSICAL CH$_F$ TS_ID$_F$ SV_ID$_F$ ... | (MONTH) (DAY) 11:00~13:00 DRAMA_1 | | (MONTH) (DAY) 13:00~14:00 SPORTS NEWS_1 | (MONTH) (DAY) 14:00~15:30 MUSIC_1 | BROADCAST STATION C ... |
| ... | ... | ... | | | | ... |

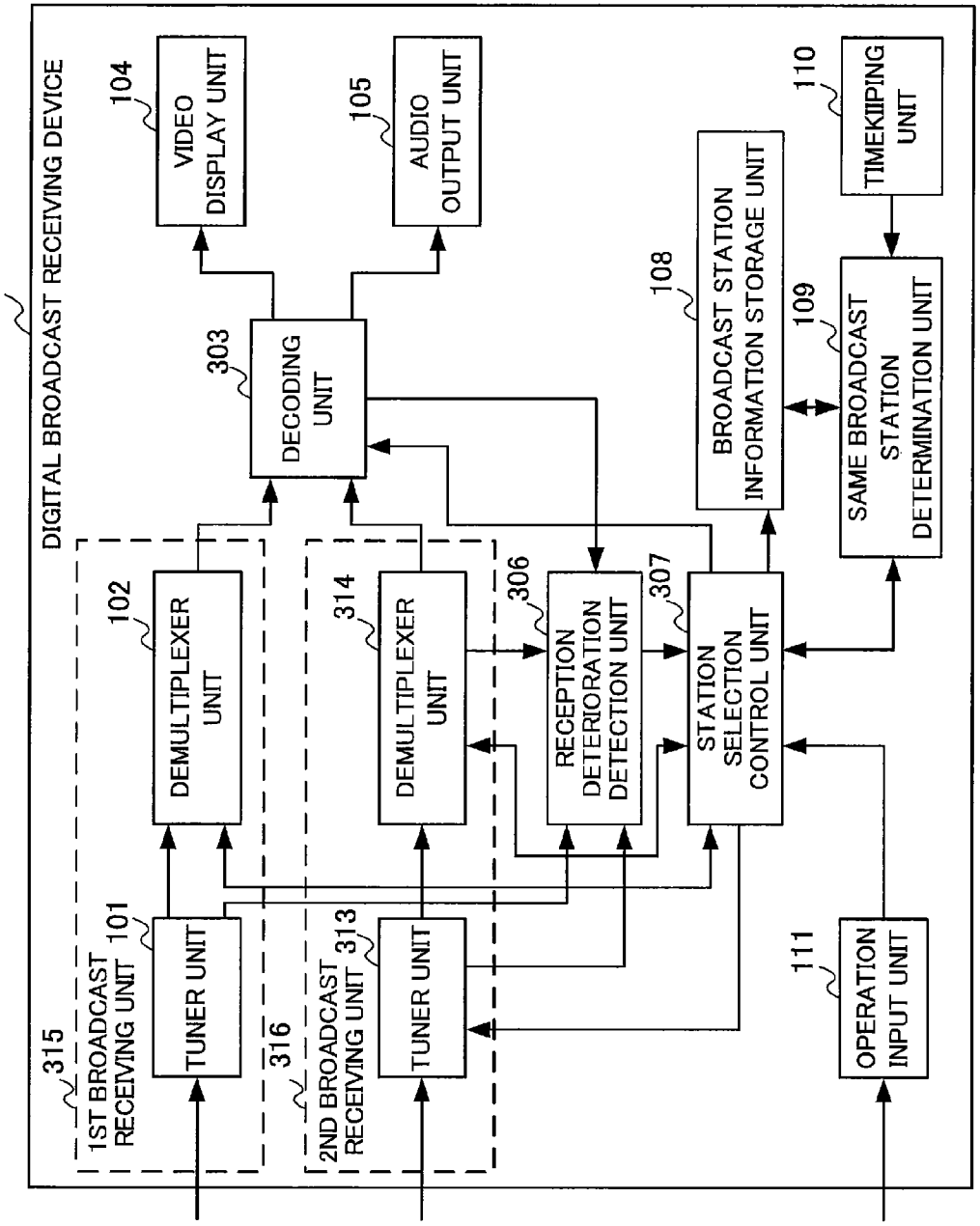

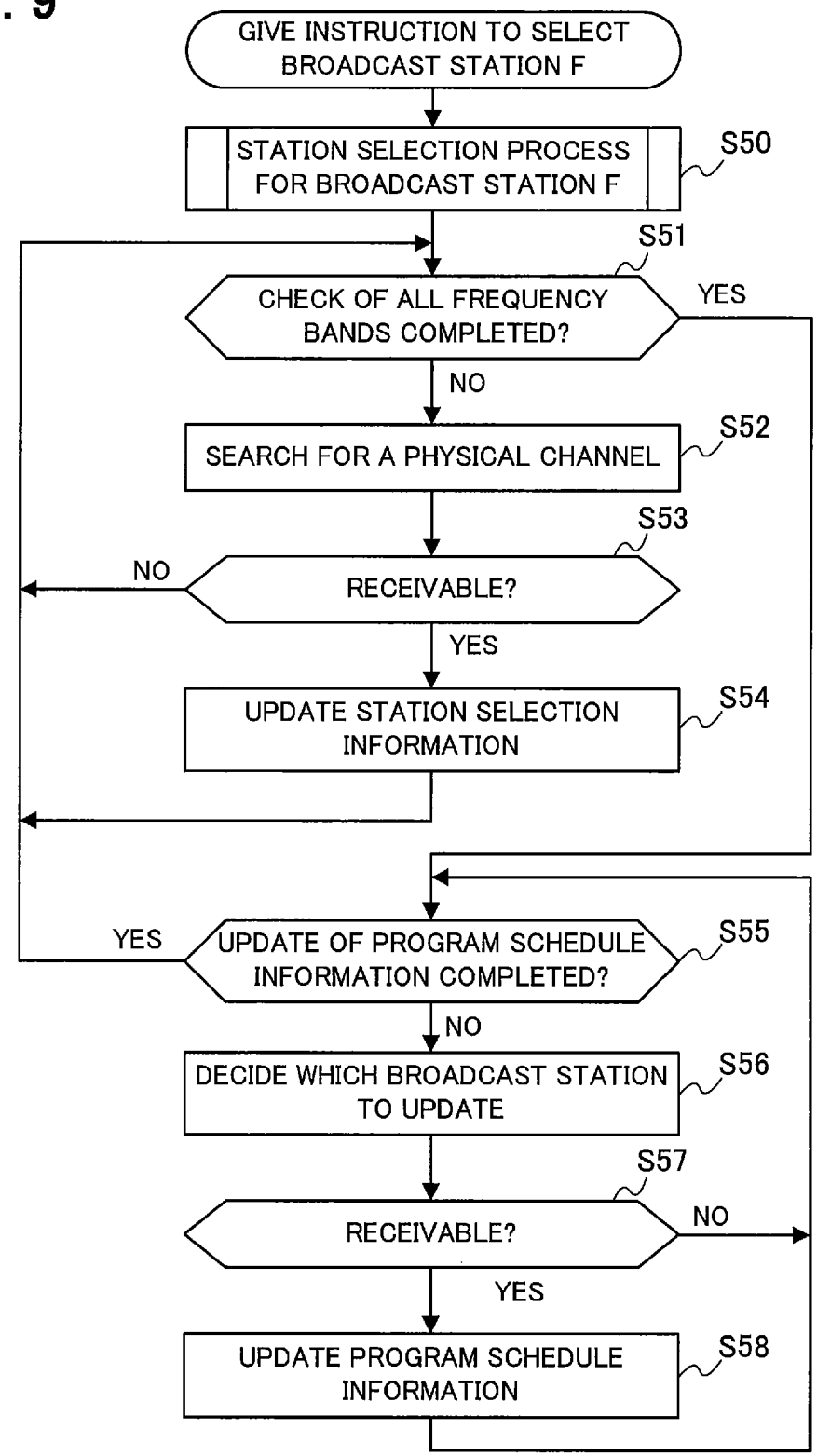

DIGITAL BROADCAST RECEIVING DEVICE AND STATION SELECTION METHOD

TECHNICAL FIELD

The present invention relates to a digital broadcast receiving device and a station selection method.

BACKGROUND ART

In the past, when reception of a program being viewed by use of a receiving device mounted in a vehicle became impossible because of a drop in the receiving level or for some other reason, it was necessary for the viewer to go to the trouble of searching through the broadcast stations one by one to find a receivable station and decide for himself or herself whether or not it was broadcasting the same program.

To eliminate the need for these troublesome procedures, the digital broadcast receiving device described in patent reference 1, for example, decides on the basis of the agreement of program identification information obtained from the broadcast signal whether or not another broadcast station is broadcasting the same program as the program currently being viewed, and when it becomes impossible to receive the program currently being viewed, automatically switches over to another broadcast station that is broadcasting the same program.

PRIOR ART REFERENCES

Patent Reference

Patent reference 1: JP 2007-36815 (paragraphs 0012-0016, FIG. 2)

SUMMARY OF THE INVENTION

Problems to be Solved by the Invention

This conventional digital broadcast receiving device, however, uses matching text information such as the broadcast station name and the program name to verify that programs are the same, and since there is no guarantee that the program information will be given in the same language in the broadcast standards for broadcasts for fixed reception and broadcasts for mobile reception, when the receiving device travels in an area where a plurality of languages are used or travels across national borders, it has not always been possible to use matching text information to detect the same program.

The present invention addresses this problem with the object of enabling a broadcast station that is broadcasting the same program as the program currently being viewed to be detected when the reception state of the broadcast signal of that program deteriorates, without being affected by the language that is used.

Means for Solving the Problem

A digital broadcast receiving device according to an embodiment of the invention comprises: a broadcast receiving unit for generating a digital signal from a received signal received at an antenna and separating, from the digital signal, video data and audio data of a program broadcast by a selected broadcast station; a reception deterioration detection unit for detecting a reception deterioration state in which a reception state of the received signal has deteriorated; a broadcast station information storage unit for storing broadcast station information including, for each broadcast station, a station selection parameter for selecting broadcast programs and a program schedule indicating broadcast times of the broadcast programs; a same broadcast station determination unit for determining that a broadcast station broadcasting a plurality of programs with the same broadcast times as the broadcast times of a plurality of programs broadcast by the selected broadcast station in a predetermined interval in the program schedules of each broadcast station included in the broadcast station information is the same broadcast station as the selected broadcast station, generating same broadcast station information associating the selected broadcast station with the broadcast station determined to be the same broadcast station, and causing the broadcast station information storage unit to store the same broadcast station information; and a station selection control unit for, when the reception deterioration detection unit detects the reception deterioration state, controlling the broadcast receiving unit so as to switch the broadcast station selection over to a same broadcast station determined by the same broadcast station determination unit or to a broadcast station indicated by the same broadcast station information stored in the broadcast station information storage unit.

Effects of the Invention

According to an embodiment of the invention, when the reception state of the broadcast signal of the program being viewed deteriorates, it is possible to detect a broadcast station broadcasting the same program without being affected by the language that is used.

BRIEF DESCRIPTION OF THE DRAWINGS

FIG. 1 is a block diagram schematically showing the configuration of a digital broadcast receiving device according to first, second and fourth embodiments.

FIG. 2 is a schematic drawing showing exemplary broadcast station information in the first embodiment.

FIG. 5 is a schematic drawing showing exemplary same broadcast station related information in the first embodiment.

FIG. 7 is a schematic drawing showing an exemplary variation of the broadcast station information in the second embodiment.

FIG. 8 is a block diagram schematically showing the configuration of a digital broadcast receiving device according to a third embodiment.

FIG. 9 is a flowchart showing processing performed by the station selection control unit in the second embodiment.

MODE FOR CARRYING OUT THE INVENTION

First Embodiment

Figure 3:
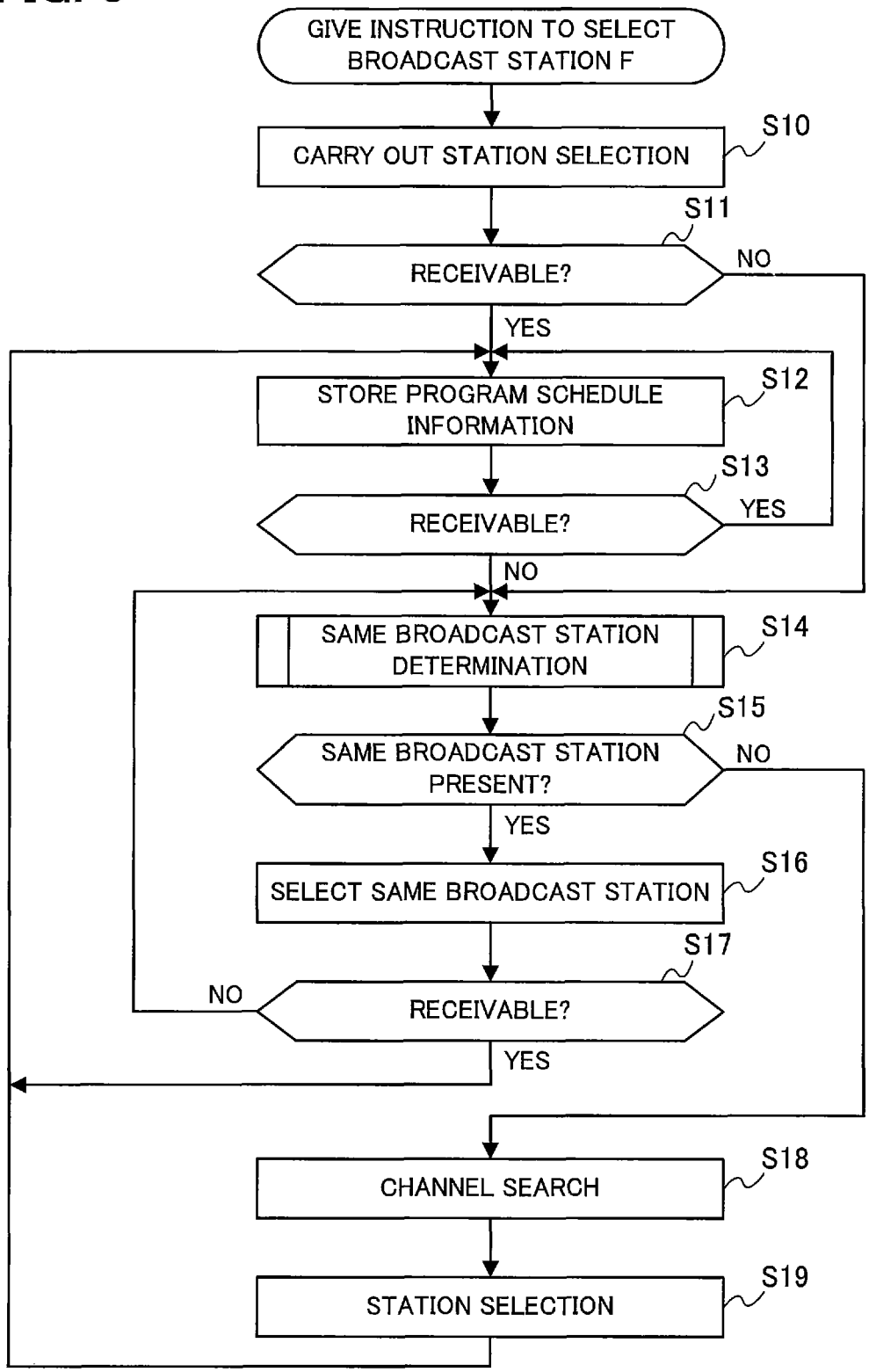
FIG. 3 is a flowchart showing processing performed by the station selection control unit in the first embodiment.

FIG. 1 is a block diagram schematically showing the configuration of the digital broadcast receiving device 100 in the first embodiment. The digital broadcast receiving device 100 has a tuner unit 101, a demultiplexer unit 102, a decoding unit 103, a video display unit 104, an audio output unit 105, a reception deterioration detection unit 106, a station selection control unit 107, a broadcast station information storage unit 108, a same broadcast station determination unit 109, a timekeeping unit 110, and an operation input unit 111. The tuner unit 101 and demultiplexer unit 102 constitute a broadcast receiving unit 112. The reference characters in parentheses in FIG. 1 apply to the second to fourth embodiments.

A received signal received by an antenna (not shown) is input to the tuner unit 101, which, on instruction from the station selection control unit 107, performs station selection, demodulation, and error correction to generate a digital signal, e.g., a TS (Transport Stream). The antenna receives a broadcast signal transmitted from a digital broadcast station. The tuner unit 101 provides the generated digital signal to the demultiplexer unit 102. The tuner unit 101 also generates and provides received signal alarm information such as received signal reception level information, received C/N ratio information, PLL lock information, frame lock information, or an error rate to the reception deterioration detection unit 106.

The demultiplexer unit 102 extracts program identification information and program configuration information, such as PSI (Program Specific Information) and SI (Service Information) in a TS, for example, as program information from the digital signal provided from the tuner unit 101, and provides the program information to the station selection control unit 107. The program information includes information related to the program being broadcast. The demultiplexer unit 102 also filters the digital signal on the basis of the extracted program information, thereby separating the video data and audio data, and provides the separated video data and audio data to the decoding unit 103. In addition, in some circumstances, such as when the above processes cannot be carried out, the demultiplexer unit 102 provides the reception deterioration detection unit 106 with received signal loss information such as loss of signal information and loss of audio or video synchronization information.

The decoding unit 103 performs video and audio decoding of the video data and audio data provided from the demultiplexer unit 102. The decoding unit 103 then provides the decoded video signal to the video display unit 104 and the decoded audio signal to the audio output unit 105. In addition, in some circumstances, such as when any of the above processing becomes impossible, the decoding unit 103 provides the reception deterioration detection unit 106 with decode alarm information, such as decode error detection information and decode error rate information.

The video display unit 104 displays a video picture on the screen on the basis of the input video signal.

The audio output unit 105 outputs sound from a speaker on the basis of the input audio signal.

Based on the received signal alarm information provided from the tuner unit 101, the received signal loss information provided from the demultiplexer unit 102, and the decode alarm information provided from the decoding unit 103, the reception deterioration detection unit 106 detects a reception deterioration state in which the reception state of the received signal has deteriorated. If the digital broadcast receiving device 100 is mounted on a vehicle such as an automobile or is carried, for example, the reception position of the digital broadcast receiving device 100 changes. Accordingly, it may happen that the reception position of the digital broadcast receiving device 100 is outside the service area of the broadcast station of the program being viewed or the digital broadcast receiving device 100 is affected by blockage or attenuation of the carrier wave due to a structure on the ground, etc., in which case it cannot receive the broadcast signal from the station broadcasting the program being viewed. For this reason, the reception deterioration detection unit 106 detects the reception deterioration state on the basis of the information obtained from the tuner unit 101, demultiplexer unit 102, and decoding unit 103. Specifically, from the above information, the reception deterioration detection unit 106 determines whether or not the received signal is in the 'now unreceivable state' or 'now nearly unreceivable state', and when it determines that the received signal is in the 'now unreceivable state' or 'now nearly unreceivable state', it recognizes that the state is a reception deterioration state. When the reception deterioration detection unit 106 recognizes a reception deterioration state, it provides a reception deterioration report to the station selection control unit 107.

The station selection control unit 107 identifies a broadcast station to select on the basis of the broadcast station information stored in the broadcast station information storage unit 108 and issues a station selection instruction to the broadcast receiving unit 112, instructing it to select the identified broadcast station.

The station selection control unit 107 performs processing for storing the program information separated by the demultiplexer unit 102. On the basis of the program information separated by the demultiplexer unit 102, the station selection control unit 107 detects changes in the station selection parameters of the broadcast station that is broadcasting the program being viewed and the program schedule of the broadcast station, and when it detects a change, it alters the broadcast station information stored in the broadcast station information storage unit 108.

Furthermore, when it receives a reception deterioration report from the reception deterioration detection unit 106, the station selection control unit 107 obtains the station selection parameters of a broadcast station determined to be the same in the same broadcast station determination unit 109 from the broadcast station information stored in the broadcast station information storage unit 108 and provides a station selection instruction to the broadcast receiving unit 112 on the basis of the obtained station selection parameters. If no same broadcast station has been found by the same broadcast station determination unit 109, the station selection control unit 107 provides a station selection instruction to the broadcast receiving unit 112 to search the channels in all frequency bands.

The station selection control unit 107 also responds to user operation requests of which it is notified by the operation input unit 111, obtains station selection parameters from the broadcast station information storage unit 108 and, on the basis of the obtained station selection parameters, issues station selection instructions to the broadcast receiving unit 112.

The broadcast station information storage unit 108 stores broadcast station information for each broadcast station, including station selection parameters for selection of the broadcast station and a program schedule, which is a schedule of programs broadcast by the broadcast station.

FIG. 2 is a schematic diagram showing exemplary broadcast station information 120 in the first embodiment. The broadcast station information 120 includes a broadcast station column 120a, a station selection information column 120b, and a program schedule information column 120c.

The broadcast station column 120a stores broadcast station identifiers for identifying broadcast stations. Here the broadcast identifiers are assigned by an arbitrary procedure such that the broadcast stations can be uniquely identified in the digital broadcast receiving device 100. For example, as shown in FIG. 2, when the broadcast station information 120 is provided as a table represented two-dimensionally by rows and columns, indexes for identifying the individual rows of the table can be used as the broadcast station identifiers. The broadcast station identifiers may be values created by combining the station selection parameters described later, or values created by some other procedure.

The station selection information column 120b stores station selection parameters for selecting broadcast stations identified by the identifiers in the broadcast station information 120. The station selection parameters are parameters needed in order to issue station selection instructions to the tuner unit 101 and demultiplexer unit 102 in order to view a program of a certain broadcast station. The station selection parameters include, for example, the necessary physical channel on which the tuner unit 101 can receive a signal from a certain broadcast station, and information needed in order for the demultiplexer unit 102 to separate a certain program broadcast by the broadcast station from the digital signal demodulated in the tuner unit 101, such as the TS_ID and SV_ID included in the PAT and PMT in the TS. The station selection parameters may also include other information, such as the NW_ID and ORG_NW_ID described in the PAT•PMT in the TS. When the digital signal is not a TS signal, it suffices for the station selection parameters to include parameters equivalent to these.

The station selection parameters are updated on instruction from the station selection control unit 107. For example, when a broadcast station identified in the broadcast station column 120a is selected and the station selection parameters used by the tuner unit 101 and demultiplexer unit 102 are altered, the station selection control unit 107 updates the station selection parameters corresponding to the selected broadcast station to the latest station selection parameters.

The program schedule information column 120c stores a program schedule indicating the broadcast times of programs broadcast by the broadcast stations identified in the broadcast station column 120a.

The program schedule includes a plurality of individual program schedules, each indicating a program name, broadcast start time, and broadcast end time. The program name, broadcast start time, and broadcast end time are included in the program information obtained by the demultiplexer unit 102. The individual schedules may include other information, such as information indicating the program genre and the names of the performers. Each of the individual schedules in FIG. 2 consists of a program name, broadcast start time, and broadcast end time, but the program name may be omitted. An individual schedule may consist of the broadcast start time and broadcast end time.

The program schedule is updated as instructed by the station selection control unit 107. For example, when a broadcast station identified in the broadcast station column 120a is selected, and the information included in the program information separated by the demultiplexer unit 102 differs from the information included in the program schedule corresponding to the selected broadcast station, the station selection control unit 107 updates the program schedule corresponding to the selected broadcast station to reflect the latest information.

The broadcast station information 120 is updated as instructed by the station selection control unit 107. For example, if a new broadcast station that has not been stored in the broadcast station information 120 is found, the station selection control unit 107 adds a new row to the broadcast station information 120, newly stores station selection parameters related to the broadcast station and a program schedule in the newly added row, assigns a new broadcast station identifier, and stores the assigned broadcast station identifier in the added row.

The broadcast station information 120 need not be stored in the form of a two dimensional table with rows and columns; it may be stored in any form provided it is possible to uniquely associate the above broadcast station identifier, station selection parameters, and program schedule with each other.

Returning to the description of FIG. 1, from all the broadcast stations stored in the broadcast station information 120, the same broadcast station determination unit 109 detects a broadcast station (also referred to below as the same broadcast station) that can be determined to be the same as the broadcast station broadcasting the program being viewed, of which it is notified from the station selection control unit 107. In this embodiment, the same broadcast station determination unit 109 decides whether a broadcast station is the same or not from whether non-linguistic information, the form of expression of which does not vary with the language being used, is the same or not, instead of relying on linguistic information the form of expression of which varies depending on the language being used.

The timekeeping unit 110 measures time. In this embodiment, it will be assumed that the time measured by the timekeeping unit 110 indicates the current time.

The operation input unit 111 receives input of user operation requests. The operation input unit 111 also reports the input operation requests to the station selection control unit 107.

FIG. 3 is a flowchart showing processing performed by the station selection control unit 107 in the digital broadcast receiving device 100 in the first embodiment. It will be assumed in this processing flow that broadcast station F is selected and the reception state of its received signal deteriorates at 11:30. It will also be assumed in this processing flow that the broadcast station information 120 shown in FIG. 2 is stored in the broadcast station information storage unit 108.

First the operation input unit 111, which has received input of a user operation requesting selection of broadcast station F, for example, notifies the station selection control unit 107 of the user operation request. Thus notified, the station selection control unit 107 obeys the user operation request by fetching the station selection parameters of broadcast station F from the broadcast station information storage unit 108 and instructing the broadcast receiving unit 112 to perform station selection (S10).

Next, the station selection control unit 107 determines, from whether or not it receives a reception deterioration report from the reception deterioration detection unit 106, whether or not the broadcast signal from broadcast station F is receivable (S11). The station selection control unit 107 proceeds to the process in step S12 if the broadcast signal is receivable (Yes in S11), and to the process in step S14 if it is not receivable (No in S11).

In step S12, the station selection control unit 107 obtains the program schedule of broadcast station F from the program information that has been separated by the demultiplexer unit 102, and updates the program schedule of broadcast station F stored in the broadcast station information 120 with the newly obtained program schedule.

Then the station selection control unit 107 determines, from whether or not it receives a reception deterioration report from the reception deterioration detection unit 106, whether or not the broadcast signal from broadcast station F is receivable (S13). The station selection control unit 107 returns to the process in step S12 if the broadcast signal is receivable (Yes in S13), and proceeds to the process in step S14 if the broadcast signal is not receivable (No in S13).

In step S14, the station selection control unit 107 instructs the same broadcast station determination unit 109 to perform a same broadcast station determination process to find a broadcast station that is the same as broadcast station F. Thus instructed, the same broadcast station determination unit 109 uses the broadcast station information 120 stored in the broadcast station information storage unit 108 to perform the same broadcast station determination process for finding a broadcast station that is the same as broadcast station F. If a broadcast station that can be determined to be the same as broadcast station F can be detected, the same broadcast station determination unit 109 sends a same broadcast station present report identifying the detected broadcast station to the station selection control unit 107; if no broadcast station that can be determined to be the same as broadcast station F can be detected, it sends a same broadcast station absent report to the station selection control unit 107. The same broadcast station determination process will be described in detail with reference to FIG. 4.

Next, the station selection control unit 107 determines whether or not a broadcast station that is the same as broadcast station F has been found (S15). The station selection control unit 107 proceeds to the process in step S16 if a broadcast station that is the same as broadcast station F has been found (Yes in S15), and to the process in step S18 if a broadcast station that is the same as broadcast station F has not been found (No in S15).

In step S16, the station selection control unit 107 fetches the station selection parameters of a broadcast station (here assumed to be broadcast station C) that can be determined to be the same as broadcast station F, as reported by the same broadcast station determination unit 109, from the broadcast station information 120 and instructs the broadcast receiving unit 112 to perform station selection.

Next, from whether or not it receives a reception deterioration report from the reception deterioration detection unit 106, the station selection control unit 107 determines whether or not the broadcast signal from broadcast station C is receivable (S17). If the broadcast signal is receivable (Yes in S17), the station selection control unit 107 returns to the process in step S12; if the broadcast signal is not receivable (No in S17), it returns to the process in step S14.

If no broadcast station the same as broadcast station F is not found (No in S15), the station selection control unit 107 proceeds to the process in step S18. In step S18, the station selection control unit 107 searches the channels in all frequency bands in sequence and performs processing to find a broadcast station (assumed here to be broadcast station E, for example) whose signal can be received at the current position.

Next, the station selection control unit 107 fetches the station selection parameters of the broadcast station E found in step S18 from the broadcast station information 120 and instructs the broadcast receiving unit 112 to perform station selection (S19). Then the station selection control unit 107 returns to the process in step S12, thereby obtains the program schedule of broadcast station E from the program information separated by the demultiplexer unit 102, and updates the program schedule of broadcast station E stored in the broadcast station information 120 with the newly obtained program schedule.

Regarding the channel search in step S14, another process for finding a broadcast station may be carried out, such as searching for an affiliated station as described in Japanese PCT Publication No. 07/125,777, for example, or some other station selection method.

Figure 4:
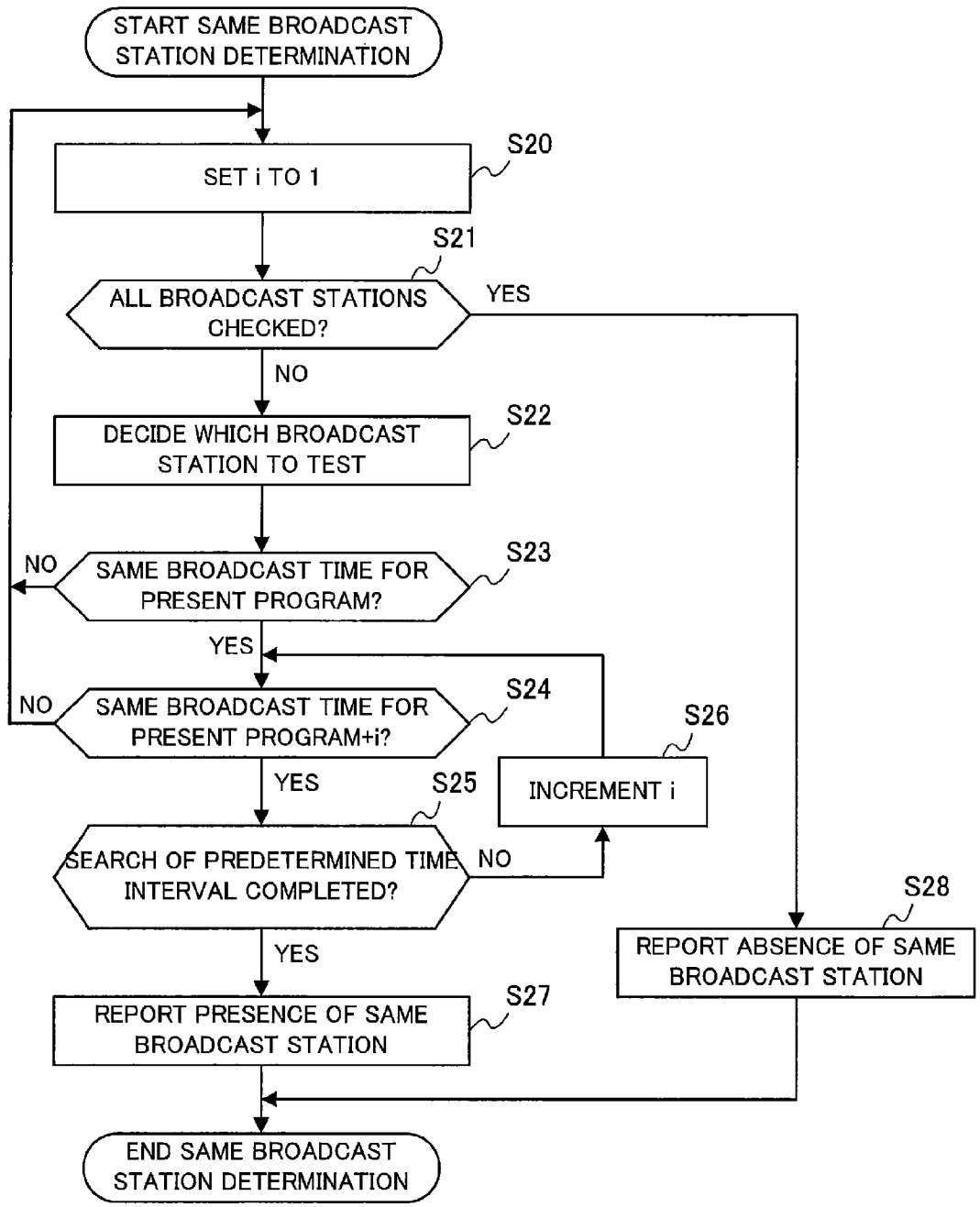
FIG. 4 is a flowchart illustrating a same broadcast station determination process in the first embodiment.

FIG. 4 is a flowchart illustrating the same broadcast station determination process by the same broadcast station determination unit 109 in the digital broadcast receiving device 100 in the first embodiment. As in FIG. 3, it will be assumed in this processing flow that broadcast station F is selected and the reception state of its received signal deteriorates at 11:30. It will also be assumed in this processing flow that the broadcast station information 120 shown in FIG. 2 is stored in the broadcast station information storage unit 108.

First, the same broadcast station determination unit 109 initializes a variable i, which indicates, in terms of number of programs, separation from the program being broadcast at the current time, to '1' (S20).

Next, the same broadcast station determination unit 109 checks whether or not it has tested all broadcast stations stored in the broadcast station information 120, other than the broadcast station F currently being viewed, in step S23 (S21). If the same broadcast station determination unit 109 has performed this test for all these broadcast stations (Yes in S21), it proceeds to the processing in step S28. If the same broadcast station determination unit 109 has not performed this test for all these broadcast stations (No in S21), that is, if there is a broadcast station that has not been tested in step S23, it proceeds to the process in step S22.

In step S22, from among the broadcast stations stored in the broadcast station information 120, the same broadcast station determination unit 109 selects one of the broadcast stations other than broadcast station F for which the test in step S23 has not been performed, and designates the selected broadcast station as the broadcast station to test. The order of selection of one broadcast station in step S22 may be the (ascending or descending) order of one of the station selection parameter values stored in the broadcast station information 120, such as the physical channel, TS_ID, or SV_ID, or a station selection history may be stored and the order may be the order of most recent selection or most frequent selection. Alternatively, the same broadcast station determination unit 109 may determine the order in some other way. The broadcast station selected for testing is one with station selection parameters, including the physical channel, that differ from those of broadcast station F. The description here will proceed on the assumption that the same broadcast station determination unit 109 has decided to test broadcast station A.

Next, the same broadcast station determination unit 109 checks whether or not the broadcast start time and broadcast end time of the program being broadcast at the current time by the broadcast station (here, broadcast station A) designated in step S22 as the broadcast station under test are the same as the broadcast start time and broadcast end time of the program that was being viewed on broadcast station F (S23). Here, as shown in FIG. 2, the broadcast start time and broadcast end time of the program being broadcast by broadcast station A at 11:30 are 11:00 and 12:00, respectively, and the broadcast start time and broadcast end time of the program being broadcast by broadcast station F are 11:00 and 13:00, respectively, so broadcast station A and broadcast station F differ in their broadcast end times (No in S23). Therefore the same broadcast station determination unit 109 returns to the process in step S20 and carries out the initialization of variable i. The decision in step S23 may be made by comparison of the broadcast start time alone or by comparison of the broadcast end time alone, but to improve the precision of the comparison, it is desirable to compare both.

The description will now proceed on the assumption that the same broadcast station determination unit 109 has decided No in step S21, has proceeded to the process in step S22, and has designated broadcast station B as the next broadcast station to test.

The same broadcast station determination unit 109 now proceeds to the process in step S23 and checks whether or not the broadcast start time and broadcast end time of the program being broadcast by the broadcast station B designated as the broadcast station under test in step S22 are the same as the broadcast station start time and broadcast end time of the program being broadcast by the broadcast station F that was being viewed. As shown in FIG. 2, the programs being broadcast by broadcast station B and broadcast station F have both the same broadcast start time and the same broadcast end time (Yes in S23). Accordingly, the same broadcast station determination unit 109 proceeds to the process in step S24.

In step S24, the same broadcast station determination unit 109 determines whether or not the broadcast start times and broadcast end times of the i-th programs broadcast (here, the first program broadcast) after the program being broadcast at the current time by the broadcast station under test (here, broadcast station B) and broadcast station F are the same. Here, the broadcast start time and broadcast end time of the first program after the program being broadcast at the current time (11:30) by broadcast station B are 13:00 and 14:00, respectively, and the broadcast start time and broadcast end time of the first program after the program being broadcast at the current time by broadcast station F are 13:00 and 14:00, respectively, so the broadcast start times and broadcast end times are the same (Yes in S24). Accordingly, the same broadcast station determination unit 109 proceeds to the process in step S25.

In step S25, the same broadcast station determination unit 109 checks whether or not all the programs included in a predetermined time interval have been tested. It will be assumed here that the same broadcast station determination unit 109 tests a twelve-hour segment of programs. Accordingly, the determination in step S24 is performed here for programs broadcast during the day up to 23:30. The broadcast end time of the program immediately after the program being broadcast at the current time is 14:00, which is still short of 23:30 (No in S25), so the same broadcast station determination unit 109 proceeds to the process in step S26. The predetermined time interval is not limited to twelve hours; an arbitrary time interval may be set. The longer the time interval is, the longer the time required for the comparison process becomes; the shorter the time interval is, the lower the precision of the comparison process becomes. The time interval may be set by the user via the operation input unit 111, for example.

In step S26, the same broadcast station determination unit 109 adds 1 to the value of variable i. The same broadcast station determination unit 109 then returns to the process in step S24.

In step S24, the same broadcast station determination unit 109 performs a comparison of the broadcast start times and broadcast end times of the i-th program broadcast after the program being broadcast at the current time by broadcast station B and broadcast station F; here the program to be broadcast two programs later are compared. Since, as shown in FIG. 2, broadcast station B and broadcast station F differ in the broadcast end times of the second program broadcast after the program being broadcast at 11:30 (No in S24), the same broadcast station determination unit 109 terminates the comparison and returns to the process in step S20.

The description will now proceed on the assumption that the same broadcast station determination unit 109 has initialized variable i in step S20, decided No in step S21, proceeded to the process in step S22, and designated broadcast station C as the next broadcast station to test.

Next the same broadcast station determination unit 109 proceeds to the process in step S23 and determines whether or not the broadcast start time and broadcast end time of the program being broadcast at the current time on the broadcast station C designated as the broadcast station under test in step S22 are the same as the broadcast start time and broadcast end time of the program being viewed on broadcast station F. As shown in FIG. 2, the programs being broadcast by broadcast station C and broadcast station F at 11:30 have the same broadcast start time and broadcast end time (Yes in S23). Accordingly, the same broadcast station determination unit 109 proceeds to the process in step S24.

In step S24, the same broadcast station determination unit 109 determines whether or not the broadcast start times and broadcast end times of the i-th program broadcast (here, the first program broadcast) after the program being broadcast at the current time by the broadcast station under test (here, broadcast station C) and broadcast station F are the same. Here, as shown in FIG. 2, the broadcast start times and broadcast end times of the first program after the program being broadcast at the current time (11:30) by broadcast station C and broadcast station F are both 13:00 and 14:00, respectively, so the broadcast start times and broadcast end times are the same (Yes in S24). Accordingly, the same broadcast station determination unit 109 proceeds to the processing in S25.

In step S25, the same broadcast station determination unit 109 checks whether or not all the programs included in the predetermined time interval have been tested in step S24. Since 23:30 has not been reached yet here (No in S25), the same broadcast station determination unit 109 proceeds to the process in step S26.

In step S26, the same broadcast station determination unit 109 adds 1 to the value of variable i. The same broadcast station determination unit 109 then returns to the process in step S24.

Then the same broadcast station determination unit 109 repeats the processes in steps S24, S25, and S26 for broadcast station C and broadcast station F, and if the broadcast start times and broadcast end times of the programs to be broadcast up to 23:30 are all the same (Yes in S25), it proceeds to the process in step S27.

In step S27, the same broadcast station determination unit 109 decides that broadcast station C and broadcast station F are the same broadcast station, and gives the station selection control unit 107 a same broadcast station present report.

When the same broadcast station determination unit 109 determines in step S21 that all the broadcast stations have been tested (Yes in S21), the same broadcast station determination unit 109 proceeds to step S28. In step S28, the same broadcast station determination unit 109 determines that the same broadcast station is not present in the broadcast stations stored in the broadcast station information 120 and gives the station selection control unit 107 a same broadcast station absent report.

In the program time comparison performed in steps S23 and S24, if the program information that can be obtained in the demultiplexer unit 102 indicates a switchover of time designation, such as to daylight saving time, then in performing the comparison process, the same broadcast station determination unit 109 excludes time intervals in which only one of the broadcast times to be compared has been switched over. If the program information separated by the demultiplexer unit 102 indicates that there is a time zone difference, the same broadcast station determination unit 109 corrects for the time zone difference before performing the comparison process.

When the program being viewed has entered the 'reception deterioration state', a conventional digital broadcast receiving device selects a program having a similar name from the broadcast station program information. However, program names are not necessarily given in the same language, so there has been the problem that, for example, identical programs described as 'Nyuusu' in Japanese and 'News' in English cannot be detected as the same program.

This embodiment, however, focuses on the fact that the start times and end times of programs broadcast by the same broadcast station are identical; when the program being viewed goes into the 'reception deterioration state', the broadcast times of the programs currently being broadcast or to be broadcast later are compared, and a broadcast station with matching broadcast times for the programs broadcast in a given time interval is determined to be the same broadcast station; accordingly, a broadcast station for which 'Nyuusu' is listed in Japanese and a broadcast station for which 'News' is listed in English can be determined to be the same broadcast station. As a result, when such broadcast stations are present, the need to scan the entire frequency band to search for a channel with the same broadcast station can be eliminated. That is, the time during which program viewing is suspended can be shortened.

In the first embodiment described above, the same broadcast station determination unit 109 only compares programs after the current time in step S24 in FIG. 4, but it may also perform a similar comparison of programs before the current time (past programs) and then make a comprehensive decision. It will also be clear that a similar effect can be achieved by comparing only programs before the current time, instead of comparing only programs after the current time.

In the first embodiment described above, in steps S23 and S24 in FIG. 4, the same broadcast station determination unit 109 checks the sameness of broadcast stations only from their broadcast times, but the method of checking sameness is not limited to this. Along with the above, the same broadcast station determination unit 109 may also use, for example, at least one other type of non-linguistic information in the program information that can be obtained from the received signal, such as a program component count, e.g., a video count, an audio count, a subtitle count, or a data broadcast count, or the program genre, the presence or absence of billing information, and a viewing restriction. The same broadcast station determination unit 109 may also determine the sameness of the broadcast stations by using at least any one of these items of information other than broadcast times. Additionally, this information is not necessarily defined in the same way by different countries and standards. For example, a broadcast for stationary reception may use numerical values such as genre ID=1, genre ID=2, . . . to define program genres such as news and music, while a broadcast for mobile reception uses different symbols, such as genre code=A, genre code=B, . . . to define program genres such as news and music. When such is the case, the same broadcast station determination unit 109 can confirm broadcast station sameness without relying on the language used by the program information, by converting the program genres to common program genre attribute identifiers, such as the symbols α and β, and using these attribute identifiers instead of using the program information as received. The attribute identifiers are not limited to symbols such as α and β. For example, the same broadcast station determination unit 109 may define text information such as 'NEWS' and 'MUSIC' as common program genre attribute identifiers and convert the program genre information obtained from the received signals in different countries and different broadcast standards to these attribute identifiers. The same broadcast station determination unit 109 may also convert program genres defined in other formats to program genre attribute identifiers. For program information other than the program genre, the same broadcast station determination unit 109 may similarly predefine attribute identifiers in some particular format for common use, convert the information obtained from the received signals to these attribute identifiers, and use them as the indicators for deciding broadcast station sameness in the first embodiment. By using these information items, the same broadcast station determination unit 109 can further narrow down the set of broadcast stations that can be determined to be identical in steps S23 and S24 in FIG. 4, so a shorter predetermined time interval can be set for the decision in step S25, and consequently, the time during which program viewing is suspended can be further shortened.

In the same broadcast station determination process in step S14 in FIG. 3 in the first embodiment described above, the process may be continued until some number of same broadcast stations have been found from among the broadcast stations stored in the broadcast station information 120, or the determination process may be performed for all the broadcast stations stored in the broadcast station information 120.

In this case, if the same broadcast station selected in step S16 in FIG. 3 is determined to be non-receivable in step S17, the same broadcast station determination unit 109 need only return to the process in step S15, select another one of the already detected multiple same broadcast stations (S16), and determine whether or not its signal is receivable (S17).

As a method of deciding which broadcast station to select from among the multiple broadcast stations that are the same in step S16, the same broadcast station determination unit 109 may check the agreement of another type of non-linguistic information in the program information that can be obtained from the received signal, such as a program component count, e.g., a video count, an audio count, a subtitle count, or a data broadcast count, or the program genre, the presence or absence of billing information, and a viewing restriction, give higher priority to stations with a higher sameness level, and select stations in descending order of priority. For example, the same broadcast station determination unit 109 may determine that the sameness level is higher as the number of information items based on which a broadcast station can be determined to be the same increases. Nor is the method of determining whether a broadcast station is the same limited to this method; the same broadcast station determination unit 109 may use some other method to verify sameness.

By proceeding this way, even when the time interval in step S25 in FIG. 4 is shortened and multiple same broadcast stations are found, they can be further narrowed down in step S16 in FIG. 3, and accordingly the time during which program viewing is suspended can be shortened.

Moreover, when the broadcast times of individual programs are compared in steps S23 and S24 in FIG. 4 in the first embodiment described above, even if the broadcast times of the programs under test differ from each other, the same broadcast station determination unit 109 may regard the broadcast times of the programs as identical provided the difference is within a given range. In this case, in order to check whether or not the difference in the broadcast times of the programs under test is within the given range, the same broadcast station determination unit 109 may make the determination from whether or not the difference is included in a predetermined time interval (a first predetermined threshold value), such as about five minutes, for example; it may also make the determination from whether or not the difference is within a predetermined percent (a second predetermined threshold value), such as about ten percent, of the broadcast duration of the program under test.

For example, if one broadcast station is scheduled to start broadcasting a program at 13:02 while another is scheduled to start broadcasting the program at 13:00 but broadcasts commercials or the like up to 13:02, the difference between the broadcast start times is two minutes, which is within the predetermined interval of five minutes, and accordingly, in this case, although the broadcast start times differ in a precise sense, the same broadcast station determination unit 109 may decide that the broadcast times are the same. Similarly, if the duration of the program broadcast is one hour, the ratio of 2 minutes to 60 minutes is 3%, which is within the predetermined 10% range, so the same broadcast station determination unit 109 may regard the broadcast times as the same even though they differ in a precise sense in this case as well. In contrast, if the broadcast duration of the program is 5 minutes, the ratio of 2 minutes to 5 minutes is 40%, which does not fall within the predetermined 10% range, so in this case, the same broadcast station determination unit 109 decides that the broadcast times are not the same.

By proceeding in this way, even when broadcast stations differ in their broadcast start times or broadcast end times in the program schedules due to a difference in the length of commercials or similar broadcast station specific content broadcast before and after the main content of the program, the same broadcast station determination unit 109 can take this difference between the broadcast start times or broadcast end times in account when making the determination as to whether they are the same broadcast station.

Permitting a difference in the broadcast times as described above reduces the number of cases in which a program with the same broadcast time is erroneously detected as a program with a different broadcast time, but increases the number of cases in which a program with a different broadcast time is erroneously detected as a program with the same broadcast time. Therefore, an extension of the given time interval over which the program schedules are tested can be made to increase the number of programs tested, thereby compensating for the decrease in the precision of same broadcast station determination due to the erroneous detection of programs as having different broadcast times.

Second Embodiment

In the digital broadcast receiving device 100 in the first embodiment, because the same broadcast station determination process, i.e., step S14, is not executed until the reception state of the signal transmitted from the broadcast station F broadcasting the program being viewed has deteriorated in step S13 in FIG. 3, the more broadcast stations that are stored in the broadcast station information 120, the more time the same broadcast station determination process requires.

The digital broadcast receiving device 200 in the second embodiment therefore executes the same broadcast station determination process before the reception deterioration state is determined to have occurred, so that it can readily select a same broadcast station at the point at which the reception state of the signal transmitted from the broadcast station broadcasting the program being viewed deteriorates.

As shown in FIG. 1, the digital broadcast receiving device 200 in the second embodiment has a tuner unit 101, a demultiplexer unit 102, a decoding unit 103, a video display unit 104, an audio output unit 105, a reception deterioration detection unit 106, a station selection control unit 207, a broadcast station information storage unit 208, a same broadcast station determination unit 109, a timekeeping unit 110, and an operation input unit 111. The digital broadcast receiving device 200 in the second embodiment differs from the digital broadcast receiving device 100 in the first embodiment in the processing in the station selection control unit 207 and the information stored in the broadcast station information storage unit 208.

The station selection control unit 207 in the second embodiment performs substantially the same processing as the station selection control unit 107 in the first embodiment. The station selection control unit 207 in the second embodiment, however, instructs the same broadcast station determination unit 109 to perform a same broadcast station determination process before the reception state of the selected broadcast station deteriorates and store the result in the broadcast station information storage unit 208.

The broadcast station information storage unit 208, stores broadcast station information 120 as in the first embodiment, and also stores same broadcast station related information that indicates, for each broadcast station, broadcast stations that can be determined to be the same as the broadcast station.

FIG. 5 is a schematic diagram showing exemplary same broadcast station related information 221 in the second embodiment. The same broadcast station related information 221 includes a broadcast station column 221*a* and a same broadcast station column 221*b*.

The broadcast station column 221*a* stores broadcast station identifiers for identifying broadcast stations.

The same broadcast station column 221*b* stores broadcast station identifiers for identifying broadcast stations that can be determined to be the same as a broadcast station identified in the broadcast station column 221*a*.

Figure 6:
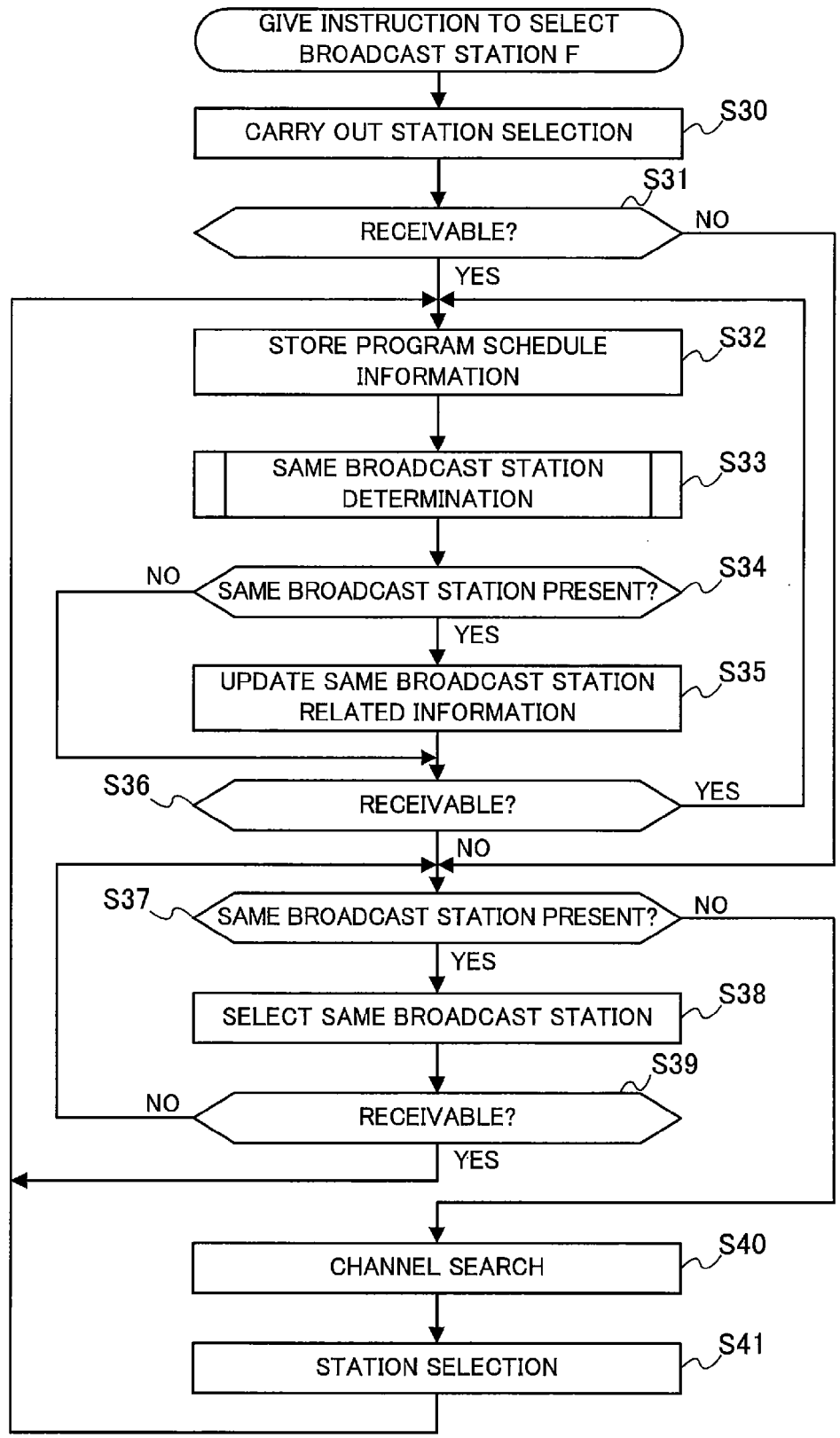
FIG. 6 is a flowchart showing processing performed by the station selection control unit in the second embodiment.

FIG. 6 is a flowchart showing processing performed by the station selection control unit 207 in the digital broadcast receiving device 200 in the second embodiment. The processes in steps S30 to S33 are similar to the processes in steps S10 to S13 in FIG. 3 in the first embodiment. The process in step S36 in FIG. 6 is the same as the process in step S17 in FIG. 3. The processes in steps S39 to S41 in FIG. 6 are the same as the processes in steps S17 to S19.

In step S34 in FIG. 6, the station selection control unit 207 determines whether or not a same broadcast station is present. For example, when it receives a same broadcast station present report from the same broadcast station determination unit 109, the station selection control unit 207 determines that a same broadcast station is present; when it receives a same broadcast station absent report, it determines that no same broadcast station is present. The station selection control unit 207 proceeds to the process in step S35 when it determines that a same broadcast station is present (Yes in S34), and to the process in step S36 when it determines that no same broadcast station is present.

In step S35, the station selection control unit 207 determines whether or not the broadcast station identified by the same broadcast station present information obtained from the same broadcast station determination unit 109 is stored in association with the currently selected broadcast station (here, broadcast station F) in the same broadcast station related information 221; if no such broadcast station is stored, the station selection control unit 207 stores the broadcast station that has been determined to be a broadcast station that is the same as broadcast station F in association with broadcast station F in the same broadcast station column 221*b*. The station selection control unit 207 then proceeds to the process in step S36.

The process in step S36 is the same as the process in step S13 in FIG. 3. If the broadcast signal from broadcast station F is determined to be unreceivable (No in S36), the station selection control unit 207 proceeds to the process in step S37.

In step S37, the station selection control unit 207 refers to the same broadcast station related information 221 stored in the broadcast station information storage unit 208, thereby checking whether or not a broadcast station that can be determined to be the same as broadcast station F and has not been selected yet in step S38 is present. If such a broadcast station is present (Yes in S37), the station selection control unit 207 proceeds to the process in step S38; if no such broadcast station is present (No in step S37), it proceeds to the process in step S40. The process in step S40 is the same as the process in step S18 in FIG. 3.

In step S38, the station selection control unit 207 refers to the same broadcast station related information 221, thereby selects a candidate station from among the broadcast stations that can be determined to be the same as broadcast station F, obtains the station selection parameters of the candidate station from the broadcast station information 120, and issues station selection instructions to the tuner unit 101 and demultiplexer unit 102. Then the station selection control unit 207 proceeds to the process in step S39. The process in step S39 is the same as the process in step S17 in FIG. 3.

In selecting a candidate station from the same broadcast station related information 221 in step S38, the station selection control unit 207 may select candidates in the (ascending or descending) order of the station selection parameter values stored in the broadcast station information 120, such as the physical channel, TS_ID, and SV_ID values. The station selection control unit 207 may also store a station selection history, and select candidates in the order of most recent selection. The station selection control unit 207 may also select in the order of most frequent selection. Alternatively, the station selection control unit 207 may select the candidates in an order determined in some other way. The station selection control unit 207 may also determine a priority order by using other non-linguistic information in the program information that can be obtained from the received signal, such as information including a program component count, e.g., a video count, an audio count, a subtitle count, or a data broadcast count, or the program genre, the presence or absence of billing information, and a viewing restriction, and may select candidates in descending priority order.

The process in step S33 may be performed for all the broadcast stations stored in the broadcast station information 120 or may be performed until some number of broadcast stations that are the same as one broadcast station can be found.

When it is determined in step S37 that there is no same broadcast station in the same broadcast station related information 221 (No in S37), the processing in steps S32 to S34 may be performed, and if it is determined in step S34 that there is no same broadcast station (No in S34), the process may then proceed to step S40.

Although the same broadcast station related information 221 is stored in the broadcast station information storage unit 208 in the second embodiment, this is not strictly necessary. The station selection control unit 207 may store this information in a storage area in some other module, e.g., a storage area in the same broadcast station determination unit 109. When the same broadcast station related information 221 is stored in the broadcast station information storage unit 208, as in the broadcast station information 220 shown in FIG. 7, for example, a same broadcast station column 220d may be added to the broadcast station information 220 to store the identifiers of broadcast stations that can be designated as the same as a broadcast station identified in the broadcast station column 220a.

Furthermore, the second embodiment describes an example in which the same broadcast station related information 221 is updated after the program schedule information is updated when a broadcast station is selected and then a same broadcast station determination is performed, but this timing of the updating the same broadcast station related information 221 is not limiting. For example, instead of performing the same broadcast station determination process and updating the same broadcast station related information 221 after every station selection and program schedule information update, the same broadcast station related information 221 may be updated only when station selections and program schedule information updates have been performed a predetermined number of times. The same broadcast station related information 221 may also be updated after a new broadcast station that is not listed in the same broadcast station related information 221 is selected and the program schedule information is updated. It is furthermore possible to update the same broadcast station related information 221 when the program schedule information is updated for the first time after a station selection performed following the elapse of a predetermined time from the last update of the same broadcast station related information 221.

As described above, the second embodiment enables the digital broadcast receiving device 200 to execute a same broadcast station identification process while a program is being viewed, before the reception state of the signal transmitted from the broadcast station broadcasting the program being viewed deteriorates, and then, as soon as the reception state of the signal transmitted from the broadcast station deteriorates, select a same broadcast station that it has identified in advance. As a result, the time interval during which program viewing is interrupted can be shortened.

Third Embodiment

Since the digital broadcast receiving devices 100, 200 in the foregoing first and second embodiments use the tuner unit 101 to receive the signal transmitted from the broadcasting stations broadcasting the program being viewed, in carrying out the same broadcast station determination process they use only the broadcast stations stored in the broadcast station information 120. Therefore, when the digital broadcast receiving device 100 or 200 moves to a position where it cannot receive any of the broadcast stations stored in the broadcast station information 120, even if another same broadcasting station is broadcasting, they cannot identify this broadcast station as a same broadcast station.

The digital broadcast receiving device in the third embodiment accordingly has an additional tuner unit and demultiplexer unit that can receive signals transmitted from broadcast stations other than the broadcast station broadcasting the program being viewed, so that even when the digital broadcast receiving device moves to a position where it cannot receive any of the broadcast stations stored in the broadcast station information 120, it can detect a same broadcast station not stored in the broadcast station information 120.

FIG. 8 is a block diagram schematically showing the configuration of a digital broadcast receiving device 300 in the third embodiment. The digital broadcast receiving device 300 has a tuner unit 101 as a first tuner unit, a demultiplexer unit 102 as a first demultiplexing unit, a decoding unit 303, a video display unit 104, an audio output unit 105, a reception deterioration detection unit 306, a station selection control unit 307, a broadcast station information storage unit 108, a same broadcast station determination unit 109, a timekeeping unit 110, an operation input unit 111, a tuner unit 313 as a second tuner unit, and a demultiplexer unit 314 as a second demultiplexing unit. The digital broadcast receiving device 300 in the third embodiment differs from the digital broadcast receiving device 100 in the first embodiment in that it further includes tuner unit 313 and demultiplexer unit 314, and in the processing in the decoding unit 303, reception deterioration detection unit 306, and station selection control unit 307. Tuner unit 101 and demultiplexer unit 102 constitute a first broadcast receiving unit 315; tuner unit 313 and demultiplexer unit 314 constitute a second broadcast receiving unit 316.

Tuner unit 313 carries out the same processing as the tuner unit 101 in the first embodiment. Demultiplexer unit 314 carries out the same processing as the demultiplexer unit 102 in the first embodiment.

Besides carrying out the same processing as the decoding unit 103 in the first embodiment, the decoding unit 303 in the third embodiment follows instructions from the station selection control unit 307 to select video data and audio data from either the demultiplexer unit 102 or demultiplexer unit 314 and decode the selected video data and audio data.

The reception deterioration detection unit 306 in the third embodiment receives respective received signal alarm information from tuner unit 101 and tuner unit 313, and receives respective received signal loss information from demultiplexer unit 102 and demultiplexer unit 314. With this, the reception deterioration detection unit 306 determines whether or not the reception state of the first broadcast receiving unit 315 and whether or not the reception state of the second broadcast receiving unit 316 is the reception deterioration state.

The station selection control unit 307 in the third embodiment issues respective station selection instructions to the first broadcast receiving unit 315 and second broadcast receiving unit 316. For example, the station selection control unit 307 instructs one of the first broadcast receiving unit 315 and second broadcast receiving unit 316 to select a broadcast station broadcasting a program to be viewed by the user and instructs the other one to select a broadcast station from which to obtain a program information.

The station selection control unit 307 also issues instructions to the decoding unit 303, instructing it to decode the audio data and video data from the first broadcast receiving unit 315 or second broadcast receiving unit 316, whichever has selected the station broadcasting the program being viewed by the user.

FIG. 9 is a flowchart illustrating the processing performed by the station selection control unit 307 in the digital broadcast receiving device 300 in the third embodiment. The description below will be made with reference to FIG. 9.

When selection of broadcast station F in response to a user operation etc. begins, first the station selection control unit 307 selects one of the first broadcast receiving unit 315 and second broadcast receiving unit 316 and performs station selection for broadcast station F (S50). The processing in step S50 is the same as the processing shown in FIG. 3. The station selection control unit 307 may arbitrarily decide which to select, the first broadcast receiving unit 315 or second broadcast receiving unit 316; the following description will assume that the first broadcast receiving unit 315 is selected. The station selection control unit 307 may select the first broadcast receiving unit 315 or second broadcast receiving unit 316 on the basis of its own operating state or the operating state of another functional block.

Next, the station selection control unit 307 checks whether or not a search of all frequency bands has been completed (S51). If the search of all frequency bands has not been completed (No in S51), in other words, if there is a frequency band that has not been searched, the station selection control unit 307 proceeds to the process in step S52; if the search of all frequency bands has been completed (Yes in S51), the station selection control unit 307 proceeds to the process in step S55.

In step S52, the station selection control unit 307 issues a search instruction to the second broadcast receiving unit 316, instructing it to search for a physical channel corresponding to a frequency band that has not been searched. Here, the method of determining the physical channel to be searched may be the ascending or descending order of the frequency band values in among all frequency bands. Alternatively, a search order history may be stored and the order may be the order of most recent selection or most frequent selection, or station selection may be performed by some other method.

Next, the station selection control unit 307 determines whether or not the signal on the physical channel for which the search instruction was issued in step S52 is receivable (S53). This determination can be made according to whether or not a reception deterioration report is received from the reception deterioration detection unit 306. If the physical channel is receivable (Yes in S53), then the station selection control unit 307 proceeds to the process in step S54; if it is not receivable (No in S53), the station selection control unit 307 returns to the process in step S51.

In step S54, the station selection control unit 307 updates, in the broadcast station information 120, the station selection parameters of the broadcast station corresponding to the physical channel the signal on which has been determined to be receivable.

In step S55, the station selection control unit 307 determines whether or not the program schedules of all the broadcast stations stored in the broadcast station information 120 have been updated. If the updating of program schedules has been completed (Yes in S55), the station selection control unit 307 returns to the process in step S51; if the updating of program schedules has not been completed (No in S55), the station selection control unit 307 proceeds to the process in step S56.

In step S56, the station selection control unit 307 selects a broadcast station for which the program schedule has not been updated, then obtains the station selection parameters of the selected broadcast station from the broadcast station information 120, and issues a station selection instruction to the second broadcast receiving unit 316. In selecting one broadcast station, the station selection control unit 307 may follow the (descending or ascending) order of one of the station selection parameter values, such as the physical channel, TS_ID, or SV_ID value, or a station selection history may be stored and the order may be the order of most recent selection or most frequent selection. Alternatively, the station selection order may be determined in some other way.

Next, the station selection control unit 307 determines whether or not the signal from the broadcast station for which it issued a station selection instruction in step S56 is receivable (S57). This determination can be made according to whether or not a reception deterioration report is received from the reception deterioration detection unit 306. If the signal is receivable (Yes in S57), then the station selection control unit 307 proceeds to the process in step S58; if the signal is not receivable, it returns to the process in step S55.

In step S58, the station selection control unit 307 updates the program schedule of the broadcast station the signal from which has been determined to be receivable in the broadcast station information 120.

In step S54 in FIG. 9, only the station selection parameters are updated, but this is not a limitation; the program schedule may also be updated at the same time and other information may be updated as well.

According to the third embodiment, while a broadcast station is being viewed, the station selection parameters and program schedules that are selectable at that position are updated, and when the reception state of the signal transmitted from the broadcast station of the program being viewed deteriorates, a same broadcast station can be determined by use of up-to-date broadcast station information 120, so it is more likely that a same broadcast station broadcasting at the position where the reception state deteriorated will be found. This can reduce the number of channel searches performed in the reception deterioration state, thereby shortening the time during which program viewing is interrupted.

The third embodiment has been described on the assumption that the digital broadcast receiving device 300 has a first broadcast receiving unit 315 and a second broadcast receiving unit 316, but the digital broadcast receiving device 300 in this embodiment, may also include more broadcast reception units, e.g., a third broadcast reception unit.

The digital broadcast receiving device 300 in the third embodiment carries out an update process for the station selection parameters in steps S51 to S54 and then carries out an update process for the program schedule in steps S55 to S58, but this order is not limiting; the reverse order is also possible. Alternatively, the digital broadcast receiving device 300 in the third embodiment may execute these processes simultaneously. In particular, when the digital broadcast receiving device 300 in the third embodiment has a third broadcast reception unit, the digital broadcast receiving device 300 may use separate broadcast reception units to execute the station selection parameter update process and the program schedule update process, and may execute each of these processes on multiple broadcast reception units concurrently to reduce the processing time.

The third embodiment has been described as carrying out the same process as in the flowchart shown in FIG. 3 for the station selection process for broadcast station F in step S50 in FIG. 9, but the station selection process may be the same as the process in the flowchart shown in FIG. 6, for example. In that case, the station selection control unit 307 also executes the same process as in the second embodiment and the broadcast station information storage unit 108 stores information as described in the second embodiment. In this case, for example, both the program schedule and the same broadcast station related information of the broadcast station may be updated in step S58 in FIG. 9. As in the second embodiment, the timing of the updating of the same broadcast station related information is not limited to performing a same broadcast station determination and updating the same broadcast station related information after every station election and program schedule update. The same broadcast station related information may be updated, for example, when the process of selecting a broadcast station and updating the program schedule has been performed a predetermined number of times, or it may be updated after a new broadcast station that is not listed in the program schedule information and same broadcast station related information is selected and the program schedule information is updated. Furthermore, the same broadcast station related information may be updated simultaneously when the program schedule information is periodically updated after a predetermined time has elapsed from the last update of the same broadcast station related information.

Fourth Embodiment

Since the digital broadcast receiving devices 100, 200, 300 in the foregoing first to third embodiments check the program broadcast times of the first program, second program, and so on in a sequence based at the programs being broadcast at the current time, they recognize a same broadcast station only when the program structures of the broadcast stations being compared match completely.

Even when broadcast stations are the same, however, during the interval from the end of one program to the start of the next program, one broadcast station may broadcast a short program such as a weather forecast, for example, while another broadcast station may keep broadcasting commercials. There are also cases in which, for example, even though one broadcast station ends the program it was broadcasting and starts broadcasting a different program, another broadcast station extends the broadcast time of the program it was broadcasting. Similarly, one broadcast station may continue broadcasting the program being viewed while another station terminates the broadcast of that program at a certain time and starts broadcasting a different program. In the foregoing first to third embodiments, such broadcast stations are determined to be different broadcast stations because their program configurations do not completely match.

More specifically, assume, for example, that broadcast station #1 and broadcast station #2 are the same broadcast station, that they have a program broadcast from 14:00 to 15:55 and a program broadcast from 16:05 to 17:00, and that in the program schedule information for broadcast station #1 there are three programs in the interval from 14:00 to 17:00 because a short program such as a weather forecast, for example, is broadcast in the interval from 15:55 to 16:05. Assume also that broadcast station #2 does not broadcast any particular program during the interval from 15:55 to 16:05 but keeps broadcasting commercials, so there are two programs in the interval from 14:00 to 17:00 in the program schedule information for broadcast station #2: a program broadcast from 14:00 to 16:00 and a program broadcast from 16:00 to 17:00.

In this case, when the programs following the program broadcast starting from 14:00 are compared, the short program broadcast from 15:55 to 16:05 by broadcast station #1 is compared with the program broadcast starting from 16:00 by broadcast station #2, resulting in failure to detect that they are the same broadcast station.

To take another case, suppose that a program broadcast from 13:00 to 14:00 is broadcast by two identical broadcast stations, broadcast station #1 and broadcast station #2, but broadcast station #1 broadcasts the program to the end, in other words, from 13:00 to 14:00, while broadcast station #2 broadcasts the program from 13:00 to 13:45 and then interrupts the program to broadcast a program of its own such as a weather forecast in the interval from 13:45 to 14:00. In this case, if the programs broadcast starting from 13:00 are compared in sequence, the program uniquely broadcast by broadcast station #2 starting at 13:45 is compared with a program broadcast by broadcast station #1 starting at 14:00, once more resulting in failure to detect that they are the same broadcast station.

The fourth embodiment therefore enables it to be determined that broadcast station #1 and broadcast station #2 are the same broadcast station even in cases like these.

As shown in FIG. 1, the digital broadcast receiving device 400 according to the fourth embodiment has a tuner unit 101, a demultiplexer unit 102, a decoding unit 103, a video display unit 104, an audio output unit 105, a reception deterioration detection unit 106, a station selection control unit 107, a broadcast station information storage unit 408, a same broadcast station determination unit 409, a timekeeping unit 110, and an operation input unit 111. The digital broadcast receiving device 400 in the fourth embodiment differs from the digital broadcast receiving device 100 in the first embodiment in the information stored in the broadcast station information storage unit 408 and the processing in the same broadcast station determination unit 409.

The broadcast station information storage unit 408 stores, for each broadcast station, broadcast station information including station selection parameters for selection of the broadcast station in the broadcast receiving unit 112, a program schedule listing the programs broadcast by the broadcast station, and one or more variables used by the same broadcast station determination unit 409 and needed to calculate a value indicating the degree to which programs with different broadcast times are included. In this embodiment, the value indicating the degree to which programs with different broadcast times are included is a cumulative error rate, and the variables needed to calculate that value are variables indicating the cumulative error rate.

Figure 10:
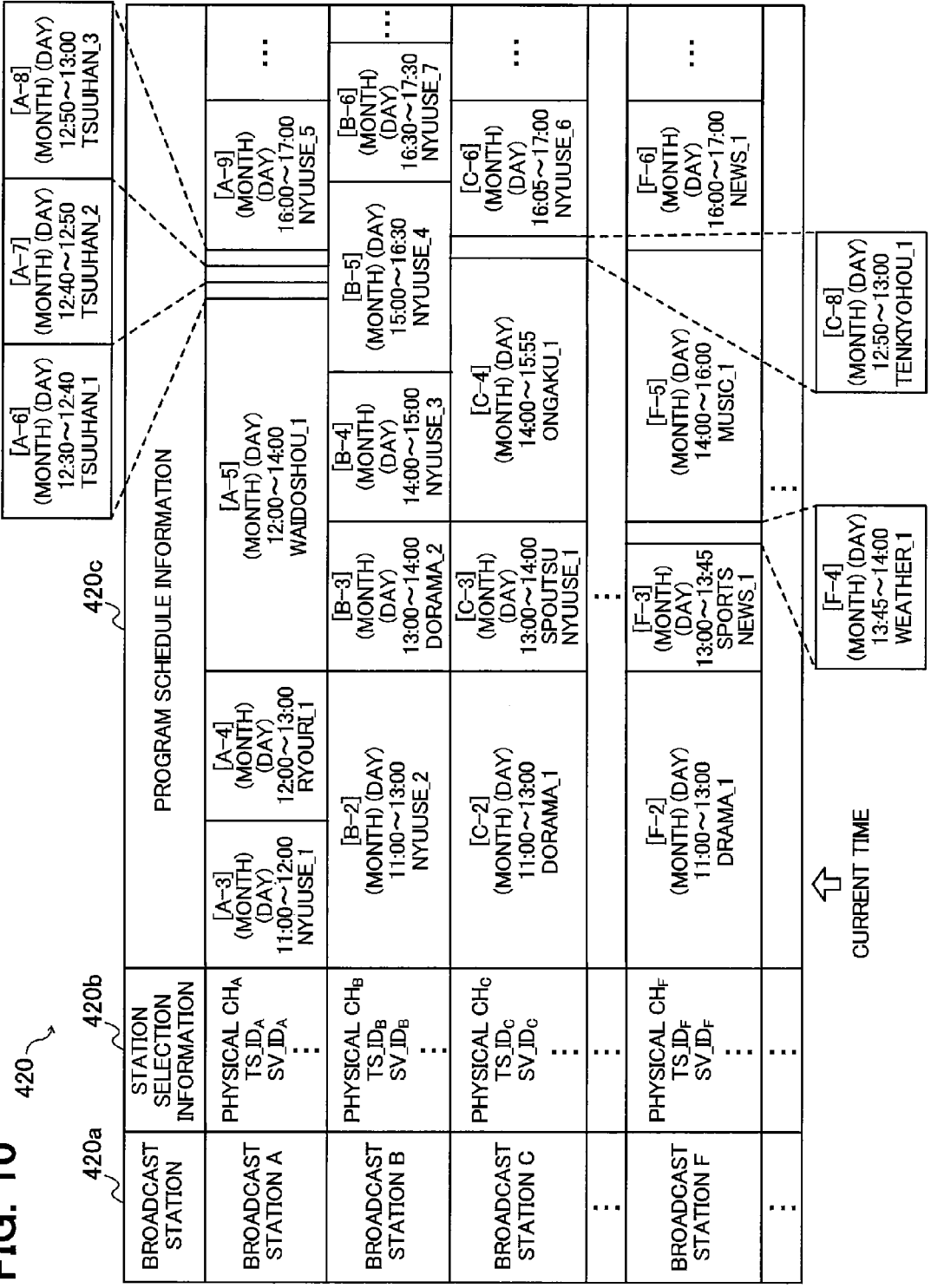
FIG. 10 is a schematic drawing showing exemplary broadcast station information in the fourth embodiment.

FIG. 10 is a schematic drawing showing exemplary broadcast station information 420 in the fourth embodiment. As with the broadcast station information 120 in the first embodiment, the broadcast station information 420 has a broadcast station column 420a, a station selection information column 420b, and a program schedule information column 420c.

Returning to the description in FIG. 1, the same broadcast station determination unit 409 detects, from among all the broadcast stations stored in the broadcast station information 420, a broadcast station that can be determined to be the same as the broadcast station broadcasting the program being viewed as reported from the station selection control unit 107. In this embodiment, in the same broadcast station determination process performed by the same broadcast station determination unit 409, even if, as a result of checking the broadcast time, which is the time interval from the broadcast start time to the broadcast end time of a program to be checked, the broadcast times of the programs being compared differ from each other, the comparison is not terminated at that point but continues through other programs included in a predetermined time period. In addition, the same broadcast station determination unit 409 stores the variable(s) needed to calculate the degree of inclusion of programs with different broadcast times in the predetermined time interval in the broadcast station information storage unit 408. The same broadcast station determination unit 409 then calculates the value indicating the degree of inclusion of programs broadcast determined to have different broadcast times as a result of the comparison of the plurality of programs broadcast in the predetermined time period; if the value is less than a predetermined value, the same broadcast station determination unit 409 regards the broadcast station as the same, thereby making it possible to detect a same broadcast station even if there is a difference in the number of programs broadcast in the predetermined interval.

Figure 11:
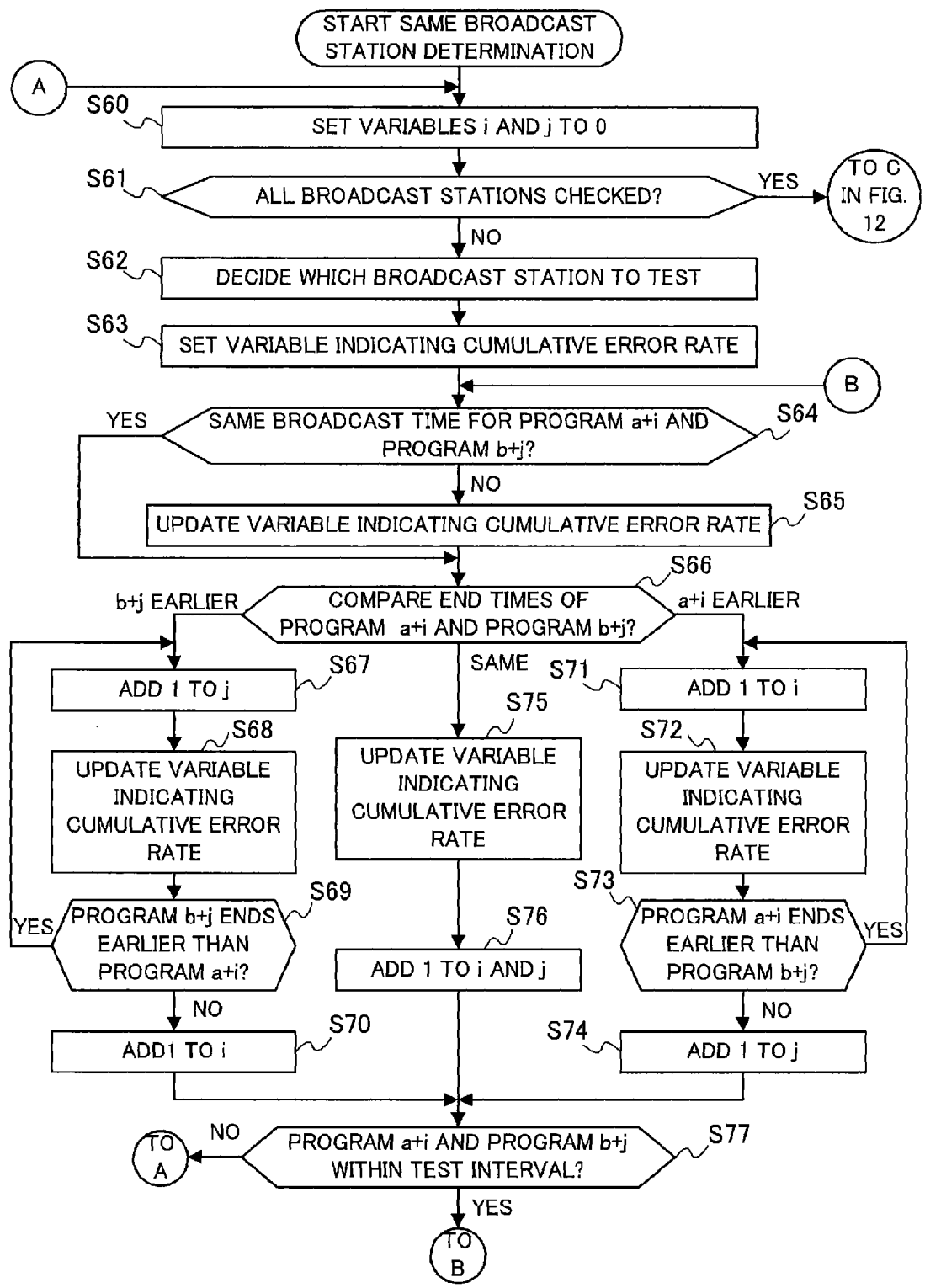
FIG. 11 is part one of a flowchart illustrating a same broadcast station determination process in the fourth embodiment.
Figure 12:
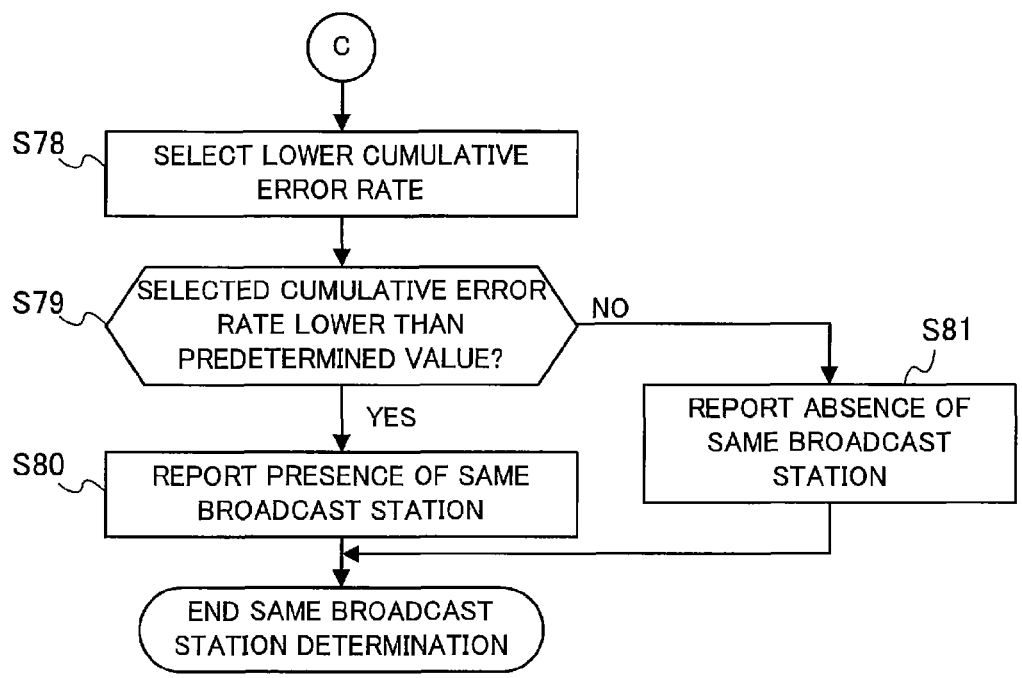
FIG. 12 is part two of the flowchart illustrating the same broadcast station determination process in the fourth embodiment.

FIGS. 11 and 12 are parts one and two of a flowchart illustrating the same broadcast station determination process in the same broadcast station determination unit 409 of the digital broadcast receiving device 400 in the fourth embodiment. This processing flow assumes that the broadcast station information 420 shown in FIG. 10 is stored in the broadcast station information storage unit 408. The processing flow also assumes that the reception state of the received signal deteriorates while broadcast station F is currently selected and program F-2 is being viewed.

First, the same broadcast station determination unit 409 initializes two variables i and j, which indicate separation from the program being broadcast at the current time in terms of number of programs, to '0' (S60). Variable i is used for the broadcast station F currently being viewed; variable j is used for a broadcast station that will be selected in step S62, described later, as the station to test.

Next, the same broadcast station determination unit 409 checks whether or not the comparison test process in step S64 and thereafter has been performed for all the broadcast stations among the broadcast stations stored in the broadcast station information 420 other than the broadcast station F being viewed at the current time (S61). If all these broadcast stations have been tested (Yes in S61), then the same broadcast station determination unit 409 proceeds to the process in step S78 in FIG. 12. If not all of these broadcast stations have been tested (No in S61), in other words, if there is a broadcast station for which the decisions in step S64 and thereafter have not been made, the same broadcast station determination unit 409 proceeds to the process in step S62.

In step S62, the same broadcast station determination unit 409 selects, from among the broadcast stations stored in the broadcast station information 420, one of the broadcast stations other than the broadcast station F currently being viewed for which the decisions in step S64 and thereafter have not been made, and designates the selected broadcast station as the broadcast station under test. The order of selection of one broadcast station in step S62 is the same as the order in step S22 in FIG. 4 in the first embodiment described above. The description here will proceed on the assumption that the same broadcast station determination unit 409 decides to test broadcast station A in step S62.

Next, the same broadcast station determination unit 409 stores the initial value of the variable(s) indicating the cumulative error rate in association with the broadcast station under test designated in step S62 in the broadcast station information storage unit 408 (S63). As described later, the variable(s) indicating the cumulative error rate and the initial value(s) vary depending on how the cumulative error rate is calculated.

Next, the same broadcast station determination unit 409 judges whether or not the i-th program broadcast after the program a being broadcast at the current time by the broadcast station (here, broadcast station F) currently being viewed (referred to below as program a+i; here, since i is '0', it is the program being broadcast at the current time) and the j-th program broadcast after the program b being broadcast at the current time by the broadcast station under test (here, broadcast station A) designated in step S62 (referred to below as program b+j; here since j is '0', it is the program being broadcast at the current time) have the same broadcast times (S64). This process is the same as the process in step S23 or S24 in FIG. 4 in the first embodiment described above.

Here, as shown in FIG. 10, the broadcast start time of the 0-th program after the program being broadcast at the current time by broadcast station F, that is, the program F-2 currently being broadcast, is 11:00, and its broadcast end time is 13:00, while the broadcast start time of the 0-th program broadcast after the program being broadcast at the current time by broadcast station A, that is, the program A-3 currently being broadcast, is 11:00 and its broadcast end time is 12:00. Here, if the agreement of broadcast times is determined only from the broadcast start times, for example, then the broadcast times are the same (Yes in S64), so the same broadcast station determination unit 409 proceeds to the process in step S66, but if the broadcast end times are also tested, the broadcast times are not the same (No in S64), so the same broadcast station determination unit 409 proceeds to the process in step S65. The description here will continue on the assumption that the processing proceeds to step S65.

In step S65, since the same broadcast station determination unit 409 has decided that the programs being compared are different, it updates the variable(s) indicating the cumulative error rate for the broadcast station under comparison that have been stored in the broadcast station information storage unit 408.

The cumulative error rate may be a value obtained by comparing the total number of times the comparative process was executed in the entire predetermined time interval with the total number of those times in which an error occurred, or a value obtained by comparing the total number of times an error occurred with a predetermined threshold. For example, the cumulative error rate ER can be calculated from equation (1) or (2) below.

[Mathematical expression 1]

$$ER = \frac{\text{Total number of times an error occurred}}{\text{Total number of times the comparative process was executed}} \quad (1)$$

The variables indicating the cumulative error rate in equation (1) are the 'total number of times an error occurred' and the 'total number of times the comparative process was executed'. Their initial values are '0'.

[Mathematical expression 2]

$$ER = \frac{\text{Total number of times an error occurred}}{\text{Predetermined threshold value}} \quad (2)$$

The variable indicating the cumulative error rate in equation (2) is the 'total number of times an error occurred'. Its initial value is '0'.

The cumulative error rate may also be a value obtained by comparing the total number of programs broadcast in the entire predetermined time interval with the total number for which an error occurred, or a value obtained by comparing the total number of programs for which an error occurred with a predetermined threshold. For example, the cumulative error rate ER can be calculated from equation (3) or (4) below.

[Mathematical expression 3]

$$ER = \frac{\text{Total number of programs for which an error occurred}}{\text{Total number of programs in predetermined time interval}} \quad (3)$$

The variables indicating the cumulative error rate in equation (3) are the 'total number of programs for which an error occurred' and the 'total number of programs in the predetermined time interval'. Their initial values are '0'.

[Mathematical expression 4]

$$ER = \frac{\text{Total number of programs for which an error occurred}}{\text{Predetermined threshold value}} \quad (4)$$

The variable indicating the cumulative error rate in equation (4) is the 'total number of programs for which an error occurred'. Its initial value is '0'.

The cumulative error rate may also be a value obtained by comparing the total broadcast time of the programs broadcast in the predetermined time interval with the total broadcast time of the programs for which an error occurred, or a value obtained by comparing the total broadcast time of programs for which an error occurred with a predetermined threshold. For example, the cumulative error rate ER can be calculated from equation (5) or (6) below.

[Mathematical expression 5]

$$ER = \frac{\text{Total broadcast time of programs for which an error occurred}}{\text{Total broadcast time of programs in predetermined time interval}} \quad (5)$$

The variables indicating the cumulative error rate in equation (5) are the 'total broadcast time of the programs for which error occurred' and the 'total broadcast time of the programs in the predetermined time interval'. Their initial values are '0'.

[Mathematical expression 6]

$$ER = \frac{\text{Total broadcast time of programs for which an error occurred}}{\text{Predetermined threshold value}} \quad (6)$$

The variable indicating the cumulative error rate in equation (6) is the 'total broadcast time of the programs for which an error occurred'. Its initial value is '0'.

Furthermore, the cumulative error rate may also be a value obtained by comparing the total broadcast time of the programs broadcast in the predetermined time interval with the total sum of the differences in the program start times of the programs for which an error occurred, or a value obtained by comparing the total sum of the differences in the program start times of the programs for which an error occurred with a predetermined threshold. For example, the cumulative error rate ER can be calculated from equation (7) or (8) below.

[Mathematical expression 7]

$$ER = \frac{\text{Total sum of differences in program start times of programs for which an error occurred}}{\text{Total broadcast time of programs in predetermined time interval}} \quad (7)$$

The variables indicating the cumulative error rate in equation (7) are the 'total sum of differences in program broadcast start times of programs for which an error occurred' and the 'total broadcast time of the programs in the predetermined time interval'. Their initial values are '0'.

[Mathematical expression 8]

$$ER = \frac{\text{Total sum of differences in program start times of programs for which an error occurred}}{\text{Predetermined threshold value}} \quad (8)$$

The variable indicating the cumulative error rate in equation (8) is the 'total sum of differences in program start times of programs for which an error occurred'. Its initial value is '0'.

In addition, the cumulative error rate may be a value obtained by comparing the total broadcast time of programs broadcast in the predetermined time interval with the total sum of differences in the program end times of those programs for which an error occurred, or a value obtained by comparing the total sum of differences in program end times of programs for which an error occurred with a predetermined threshold. For example, the cumulative error rate ER can be calculated from equation (9) or (10) below.

[Mathematical expression 9]

$$ER = \frac{\text{Total sum of differences in program end times of programs for which an error occurred}}{\text{Total broadcast time of programs in the predetermined time interval}} \quad (9)$$

The variables indicating the cumulative error rate in equation (9) are the 'total sum of differences in program end times of programs for which an error occurred' and the 'total broadcast time of programs in the predetermined time interval'. Their initial values are '0'.

[Mathematical expression 10]

$$ER = \frac{\text{Total sum of differences in program end times of programs for which an error occurred}}{\text{Predetermined threshold value}} \quad (10)$$

The variable indicating the cumulative error rate in equation (4) is the 'total sum of differences in program end times of programs for which an error occurred'. Its initial value is '0'.

The cumulative error rate may also be a value obtained by some other method.

When the value indicating a cumulative error rate for the same program has been updated in step S68, S72, or S76, described later, if the error rate is updated again here, it will have been updated twice, so the update process here may be executed as shown, or left unexecuted.

Next, the same broadcast station determination unit 409 compares the broadcast end times of program a+i and program b+j (S66). If it determines that the broadcast end time of program b+j is earlier than that of program a+i in step S66, the same broadcast station determination unit 409 proceeds to the process in step S67. If it determines that the broadcast end time of program a+i is earlier than that of program b+j in step S66, the same broadcast station determination unit 409 proceeds to the process in step S71. If it determines that the both broadcast end times are the same, the same broadcast station determination unit 409 proceeds to the process in step S75.

In this example, the broadcast end time of the 0-th program broadcast after the program being broadcast at the current time by broadcast station F, i.e., the program F-2 currently being broadcast, is 13:00, and the broadcast end time of the 0-th program broadcast after the program being broadcast at the current time by broadcast station A, i.e., the program A-3 currently being broadcast, is 12:00, so the same broadcast station determination unit 409 determines that the broadcast end time of the program of the broadcast station A under test is earlier and proceeds to the process in step S67.

In step S67, the same broadcast station determination unit 409 adds '1' to variable j, thereby advancing the program of the broadcast station under test by one.

Next, as in step S65, the same broadcast station determination unit 409 updates the variable(s) indicating the cumulative error rate (S68).

Then the same broadcast station determination unit 409 compares the broadcast end times of program a+i and program b+j (S69). If the same broadcast station determination unit 409 determines in step S69 that the broadcast end time of program b+j is earlier than that of program a+i (Yes in S69), it returns to the process in step S66. If it determines that the broadcast end times of program a+i and program b+j are the same or that the broadcast end time of program b+j is later than that of program a+i (No in S69), the same broadcast station determination unit 409 recognizes that all the programs broadcast by the broadcast station designated in step S62 during the broadcast time of program a+i have been tested, and in order to execute a comparative process in the next time period for the broadcast station currently being viewed, it adds 1 to variable i (S70) and proceeds to the process in step S77.

Here, since '1' is added to variable j in step S67, the variable indicating the cumulative error rate for the first program after the program b being broadcast at the current time by broadcast station A, namely program A-4, is updated in step S68. In addition, in step S69, the broadcast end time of the 0-th program after the program being broadcast at the current time by broadcast station F, namely the program F-2 currently being broadcast, and the broadcast end time of program A-4 are compared. The broadcast end time of program F-2 is 13:00 and the broadcast end time of program A-4 is also 13:00, so, according to the decision in step S69, the process proceeds to step S70. Then, in step S70, variable i is incremented by '1' and the process proceeds to step S77.

If, in step S66, the broadcast end time of program a+i is determined to be earlier than that of program b+j, then the same broadcast station determination unit 409 proceeds to the process in step S71. In step S71, '1' is added to variable i. Then, as in step S65 or S68, the same broadcast station determination unit 409 updates the variable(s) indicating the cumulative error rate (S72).

The same broadcast station determination unit 409 also compares the broadcast end times of program a+i and program b+j (S73). If, in step S73, it determines that the broadcast end time of program a+i is earlier than that of program b+j (Yes in S73), the same broadcast station determination unit 409 returns to the process in step S71. If, however, it determines in step S73 that the broadcast end times of program a+i and program b+j are the same or the broadcast end time of a+i is later than that of program b+j (No in S68), then the same broadcast station determination unit 409 recognizes that all the programs broadcast by the broadcast station currently being viewed during the broadcast time of program b+j broadcast by the broadcast station designated in step S62 have been tested, and in order to execute a comparison test process in the next time period of the broadcast station designated in step S62, the same broadcast station determination unit 409 adds '1' to variable j (S74) and proceeds to the process in step S77.

If the same broadcast station determination unit 409 determines that the broadcast end times of program a+i and program b+j are identical in step S66, it recognizes that the testing of programs simultaneous with program a+i and program b+j has been completed, adds '1' to variables i and j (S76), and proceeds to the process in step S77.

Next, the same broadcast station determination unit 409 checks whether or not the i-th program after the program a being broadcast at the current time by the broadcast station currently being viewed (here, since i has been updated to '1', the first program after the program being broadcast at the current time) and the j-th program after the program b being broadcast at the current time by the broadcast station under test designated in step S62 (here, since j has been updated to '1', the first program after the program being broadcast at the current time) are programs broadcast within the predetermined test interval (S77). If it determines that they are programs broadcast in the predetermined test interval (Yes in S77), the same broadcast station determination unit 409 returns to the process in step S64. If it determines that they are not programs broadcast during the predetermined test interval (No in S77), the same broadcast station determination unit 409 returns to the process in step S60. This decision may be made according to whether or not just one of the programs is broadcast within the predetermined test interval. It may also be made according to whether or not both programs are broadcast within the test interval. Furthermore, the decision may be made according to, for example, whether or not the program start times are included in the test interval, or whether or not the program end times are included in the test interval, or both of these. In addition, the decision may be made according to whether or not the proportion of the program broadcast time included in the test interval is greater than a predetermined threshold value. The decision may also be made by some other method.

Here, suppose that the predetermined test interval is 12 hours. In this case, the broadcast end time of the first program after the program being broadcast at the current time by broadcast station F, namely program F-3, is 13:45, and the broadcast end time of the first program after the program being broadcast at the current time by broadcast station A, namely program A-4, is 13:00, and accordingly it can be seen that both programs are broadcast within the 12 hours, so the same broadcast station determination unit 409 returns to the process in step S63.

In comparison with the first embodiment described above, the fourth embodiment lowers the criteria for determining that programs have the same broadcast times, so while reducing failures to detect same broadcast stations, it increases the number of cases in which a differing broadcast station is erroneously determined to be the same broadcast station. However, the predetermined test interval can be extended to test more programs, thereby reducing the number of cases in which a differing broadcast station is erroneously determined to be the same broadcast station. Therefore, by extending the test interval required for the same broadcast station determination process sufficiently to compensate for the lowering of the criteria for the same program broadcast time determination, the increase in the number of cases in which a differing broadcast station is determined to be the same broadcast station can be mitigated.

Next, returning to the process in step S64, the same broadcast station determination unit 409 performs the comparative test process on the programs corresponding to the updated variables i and j. Here, the same broadcast station determination unit 409 compares the program broadcast times of the first program after the program being broadcast at the current time by broadcast station F, namely program F-3, and the first program after the program being broadcast at the current time by broadcast station A, namely program A-4. In this case, since the broadcast times differ, the same broadcast station determination unit 409 proceeds to the process in step S65, but since the variable(s) indicating the cumulative error rate for program A-4 have already been updated in step S68 described above, this process may be omitted here and the same broadcast station determination unit 409 may proceed to the process in step S66.

After this, in step S66, the same broadcast station determination unit 409 determines that the broadcast end time of program b+j is earlier than that of program a+i, so it proceeds to step S67 to execute the same processing again and continues the comparative test process for another program in the predetermined test interval.

These processes are iterated for all the programs of all the broadcast stations included in the test interval. Then, when it is determined in step S61 that all the broadcast stations have been checked (Yes in S61), the process proceeds to step S78 in FIG. 12.

In step S78 in FIG. 12, the same broadcast station determination unit 409 calculates a cumulative error rate for each broadcast station by using the variables indicating the cumulative error rate stored in the broadcast station information storage unit 408. Then the same broadcast station determination unit 409 selects the broadcast station with the lowest cumulative error rate.

Next, the same broadcast station determination unit 409 determines whether or not the cumulative error rate of the selected broadcast station is less than a predetermined value (S79). If the cumulative error rate of the selected broadcast station is less than the predetermined value (Yes in S79), then the same broadcast station determination unit 409 proceeds to the process in step S80. If the cumulative error rate of the selected broadcast station is not less than the predetermined value (No in S79), then the same broadcast station determination unit 409 proceeds to the process in step S81.

In step S80, the same broadcast station determination unit 409 determines that the broadcast station selected in step S78 and broadcast station F are the same broadcast stations and gives the station selection control unit 107 a same broadcast station present report identifying the selected broadcast station.

In step S81, on the other hand, the same broadcast station determination unit 409 determines that no same broadcast station is present among the broadcast stations stored in the broadcast station information 420, and gives the station selection control unit 107 a same broadcast station absent report.

As described above, in comparing the program schedules of broadcast stations, even when a difference is found, the digital broadcast receiving device 400 according to the fourth embodiment calculates the rate of occurrence of such differences before deciding whether or not a broadcast station is the same, so even when each broadcast station has its own schedule configuration and differences in the broadcast times are present, a same broadcast station can be detected if the rate of occurrences of the differences is small. As a result, the time interval during which program viewing is interrupted can be further shortened.

In the fourth embodiment above, the same broadcast station determination unit 409 executes the comparative process for all the programs broadcast within the predetermined test interval, but this is not a limitation. The same broadcast station determination unit 409 may terminate the process, even in mid-flow, whenever it becomes clear that the cumulative error rate will be large. For example, when as a result of an update of variables indicating the cumulative error rate in step S65, S68, S72, or S75 in FIG. 11 a variable indicating the cumulative error rate exceeds a predetermined value, or when the cumulative error rate calculated from the variable indicating the cumulative error rate exceeds a predetermined value, the same broadcast station determination unit 409 may terminate the testing of the broadcast station and return to the process in step S60 to execute the comparative process on another broadcast station. Doing this reduces the number of processing steps in the fourth embodiment, resulting in a further shortening of the time during which program viewing is suspended.

Furthermore, in the fourth embodiment, the same broadcast station determination unit 409 calculates cumulative error rates for all the broadcast stations and then decides which broadcast station is most likely to be the same broadcast station, but the embodiment is not limited to this process. For example, before obtaining the variables indicating the cumulative error rates for all the broadcast stations, the same broadcast station determination unit 409 may calculate cumulative error rates for broadcast stations for which the variables indicating the cumulative error rate have already been obtained, and once it finds a broadcast station whose cumulative error rate falls below a predetermined value, it may determine that that broadcast station is a same broadcast station and terminate the same broadcast station determination process. For example, before designating the broadcast station under test in step S62 in FIG. 11, the same broadcast station determination unit 409 may calculate cumulative error rates of the broadcast stations it has tested so far, and once it finds a cumulative error rate that falls below a predetermined value, it may terminate the comparative process and select that broadcast station as a same broadcast station. This reduces the number of processing steps in the fourth embodiment, resulting in a further shortening of the time during which program viewing is suspended.

According to the fourth embodiment, even if part of a program schedule is altered at the discretion of the broadcast station, if the alteration is minor, the broadcast station can be determined to be a same broadcast station. When a live sports program is broadcast, for example, even when one broadcast station switches over to the next program according to the program schedule while another broadcast station alters the program schedule to extend the sports program broadcast, the effect of this can be reduced, and accordingly these broadcast stations can be detected as the same. Or when, for example, one broadcast station uses the time between one program and the next to broadcast commercials, which are not listed in the program schedule, while another broadcast station broadcasts a program of its own such as a local news program, the effect of this can be reduced, so these broadcast stations can be detected as the same. The fourth embodiment increases the number of cases in which a same broadcast station can be detected, so when it becomes impossible to receive the program being viewed, a same broadcast station can be selected quickly. As a result, the time period in which program viewing is interrupted can be further shortened.

REFERENCE CHARACTERS

100, 200, 300, 400: digital broadcast receiving device, 101: tuner unit, 102: demultiplexer unit, 103, 303: decoding unit, 104: video display unit, 105: audio output unit, 106, 306: reception deterioration detection unit, 107, 207, 307: station selection control unit, 108, 208, 408: broadcast station information storage unit, 109, 409: same broadcast station determination unit, 110: timekeeping unit, 111: operation input unit, 112: broadcast receiving unit, 313: tuner unit, 314: demultiplexer unit, 315: first broadcast receiving unit, 316: second broadcast receiving unit.

What is claimed is:

1. A digital broadcast receiving device comprising:
a broadcast receiving unit for generating a digital signal from a received signal received at an antenna and separating, from the digital signal, video data and audio data of a program broadcast by a selected broadcast station;
a reception deterioration detection unit for detecting a reception deterioration state in which a reception state of the received signal has deteriorated;
a broadcast station information storage unit for storing broadcast station information including, for each broadcast station, a station selection parameter for selecting broadcast programs and a program schedule having a plurality of individual schedules each indicating a broadcast start time and a broadcast end time or a broadcast start time and a broadcast duration of an individual program;
a same broadcast station determination unit for comparing the program start times and the program end times of the individual schedules of a broadcast station under test, the broadcast station under test being a broadcast station other than the selected broadcast station and the individual schedules of the selected broadcast station in the respective program schedules and, when the program start times and the program end times of a plurality of individual schedules of the broadcast station under test and a plurality of individual schedules of the selected broadcast station included in a predetermined time interval match, determining that the broadcast station under test is the same broadcast station as the selected broadcast station, generating same broadcast station information associating the selected broadcast station with the broadcast station determined to be the same broadcast station, and causing the broadcast station information storage unit to store the same broadcast station information; and
a station selection control unit for, when the reception deterioration detection unit detects the reception deterioration state, controlling the broadcast receiving unit so as to switch the broadcast station selection over to a same broadcast station determined by the same broadcast station determination unit or to a broadcast station indicated by the same broadcast station information stored in the broadcast station information storage unit.

2. The digital broadcast receiving device of claim 1 wherein, in determining whether or not programs being broadcast by two broadcast stations have the same broadcast times, the same broadcast station determination unit excludes, from the predetermined interval, an interval in which one of the broadcast times is changed by daylight saving time and another one of the broadcast times is not changed.

3. The digital broadcast receiving device of claim 1 wherein, in determining whether or not programs being broadcast by two broadcast stations have the same broadcast times, if at least one of the broadcast times includes a time zone difference, the same broadcast station determination unit corrects the broadcast times to eliminate the time zone difference.

4. The digital broadcast receiving device of claim 1 wherein, in determining whether or not programs being broadcast by two broadcast stations have the same broadcast times, the same broadcast station determination unit regards the broadcast times of two programs as the same even when the broadcast times of the two programs differ, provided they differ by a value less than a predetermined first threshold or the amount by which they differ forms a fraction of the broadcast time less than a predetermined second threshold.

5. The digital broadcast receiving device of claim 1 wherein, in determining whether or not two broadcast stations are the same broadcast station, the same broadcast station determination unit regards the two broadcast stations as being the same broadcast station when a value indicating a degree to which programs with differing broadcast times are included among the plurality of programs being broadcast by the two broadcast stations is lower than a predetermined value.

6. The digital broadcast receiving device of claim 5, wherein the value indicating the degree to which programs with differing broadcast times are included among the plurality of programs being broadcast by the two broadcast stations is: at least one value among a number of programs with differing broadcast times, a broadcast time duration of the programs with differing broadcast times, a difference between broadcast start times of the programs with differing broadcast times, a difference between broadcast end times of the programs with differing broadcast times, and a sum of the difference between broadcast start times and the difference between broadcast end times of the programs with differing broadcast times; a fraction of the total number of all the programs broadcast within the predetermined time interval formed by the number of programs with differing broadcast times; or a fraction of a total broadcast time of all the programs broadcast within the predetermined time interval formed by at least one value among the broadcast time duration of the programs with differing broadcast times, the difference between broadcast start times of the programs with differing broadcast times, the difference between broadcast end times of the programs with differing broadcast times, and the sum of the difference between broadcast start times and the difference between broadcast end times of the programs with differing broadcast times.

7. The digital broadcast receiving device of claim 1, wherein:
the broadcast station information includes at least one of, for each program, a video count, an audio count, a subtitle count, a data broadcast count, a genre, billing information, and presence or absence of a viewing restriction; and
the same broadcast station determination unit determines a broadcast station broadcasting a plurality of programs with the same broadcast times as the broadcast times of the plurality of programs broadcast by the selected broadcast station in the predetermined interval to be the same broadcast station as the selected broadcast station if the plurality of programs broadcast by the broadcast station each have at least one of the same video count, the same audio count, the same subtitle count, the same data broadcast count, the same genre, the same billing information, and the same presence or absence of the viewing restriction as the plurality of programs broadcast by the selected broadcast station.

8. The digital broadcast receiving device of claim 1, wherein the same broadcast station determination unit performs a same broadcast station determination when the reception deterioration state is detected, when a broadcast station not included in the broadcast station information stored in the broadcast station information storage unit is newly received, when a station selection parameter or a broadcast schedule included in the broadcast station information stored in the broadcast station information storage unit is updated, or when a predetermined interval has elapsed from a time at which the same station determination was last performed.

9. The digital broadcast receiving device of claim 1, wherein the same broadcast station determination unit generates or updates the broadcast station information when it has performed the same broadcast station determination or has performed the same broadcast station determination a predetermined number of times.

10. The digital broadcast receiving device of claim 1, wherein:
the same broadcast station information indicates a plurality of broadcast stations determined to be the same broadcast station; and
when deterioration of the reception state of the received signal is detected, the station selection control unit controls the broadcast receiving unit so as to switch the broadcast station selection over to a broadcast station in the plurality of broadcast stations indicated by the same broadcast station information sequentially in a priority order, starting from high priority.

11. The digital broadcast receiving device of claim 1, wherein when the same broadcast station determination unit cannot detect a broadcast station determinable to be the same broadcast station, the station selection control unit controls the broadcast receiving unit, searches all frequency bands in order, and detects a receivable broadcast station.

12. The digital broadcast receiving device of claim 1, wherein the digital broadcast receiving device has a plurality of broadcast receiving units, and the station selection control unit:
causes one broadcast receiving unit among the plurality of broadcast receiving units to separate the video data and the audio data broadcast by the selected broadcast station; and
controls another broadcast receiving unit among the plurality of broadcast receiving units by causing the another broadcast receiving unit to search all frequency bands in order and separate program information including information related to broadcast programs from the digital signal, and updates the broadcast station information on a basis of the separated program information.

13. A station selection method comprising:
a broadcast receiving step for generating a digital signal from a received signal received at an antenna and separating, from the digital signal, video data and audio data of a program broadcast by a selected broadcast station;
a reception deterioration detection step for detecting a reception deterioration state in which a reception state of the received signal has deteriorated;
a broadcast station information storage step for storing broadcast station information including, for each broadcast station, a station selection parameter for selecting broadcast programs and a program schedule having a plurality of individual schedules each indicating a broadcast start time and a broadcast end time or a broadcast start time and a broadcast duration of an individual program;

a same broadcast station determination step for comparing the program start times and the program end times of the individual schedules of a broadcast station under test, the broadcast station under test being a broadcast station other than the selected broadcast station, and the individual schedules of the selected broadcast station in the respective program schedules and, when the program start times and the program end times of a plurality of individual schedules of the broadcast station under test and a plurality of individual schedules of the selected broadcast station included in a predetermined time interval match, determining that the broadcast station under test is the same broadcast station as the selected broadcast station, generating same broadcast station information associating the selected broadcast station with the broadcast station determined to be the same broadcast station, and causing the same broadcast station information to be stored; and a station selection control step for, when the reception deterioration state is detected in the reception deterioration detection step, controlling the broadcast receiving step so as to switch the broadcast station selection over to a same broadcast station determined in the same broadcast station determination step or to a broadcast station indicated by the same broadcast station information stored in the broadcast station information storage step.

14. The station selection method of claim 13 wherein, in determining whether or not programs being broadcast by two broadcast stations have the same broadcast times, the same broadcast station determination step excludes, from the predetermined interval, an interval in which one of the broadcast times is changed by daylight saving time and another one of the broadcast times is not changed.

15. The station selection method of claim 13 wherein, in determining whether or not programs being broadcast by two broadcast stations have the same broadcast times, if at least one of the broadcast times includes a time zone difference, the same broadcast station determination step corrects the broadcast times to eliminate the time zone difference.

16. The station selection method of claim 13 wherein, in determining whether or not programs being broadcast by two broadcast stations have the same broadcast times, the same broadcast station determination step regards the broadcast times of two programs as the same even when the broadcast times of the two programs differ, provided they differ by a value less than a predetermined first threshold or the amount by which they differ forms a fraction of the broadcast time less than a predetermined second threshold.

17. The station selection method of claim 13 wherein, in determining whether or not two broadcast stations are the same broadcast station, the same broadcast station determination step regards the two broadcast stations as being the same broadcast station when a value indicating a degree to which programs with differing broadcast times are included among the plurality of programs being broadcast by the two broadcast stations is lower than a predetermined value.

18. The station selection method of claim 17, wherein the value indicating the degree to which programs with differing broadcast times are included among the plurality of programs being broadcast by the two broadcast stations is: at least one value among a number of programs with differing broadcast times, a broadcast time duration of the programs with differing broadcast times, a difference between broadcast start times of the programs with differing broadcast times, a difference between broadcast end times of the programs with differing broadcast times, and a sum of the difference between broadcast start times and the difference between broadcast end times of the programs with differing broadcast times; a fraction of the total number of all the programs broadcast within the predetermined time interval formed by the number of programs with differing broadcast times; or a fraction of a total broadcast time of all the programs broadcast within the predetermined time interval formed by at least one value among the broadcast time duration of the programs with differing broadcast times, the difference between broadcast start times of the programs with differing broadcast times, the difference between broadcast end times of the programs with differing broadcast times, and the sum of the difference between broadcast start times and the difference between broadcast end times of the programs with differing broadcast times.

19. The station selection method of claim 13, wherein:
the broadcast station information includes at least one of, for each program, a video count, an audio count, a subtitle count, a data broadcast count, a genre, billing information, and presence or absence of a viewing restriction; and
the same broadcast station determination step determines a broadcast station broadcasting a plurality of programs with the same broadcast times as the broadcast times of the plurality of programs broadcast by the selected broadcast station in the predetermined interval to be the same broadcast station as the selected broadcast station if the plurality of programs broadcast by the broadcast station each have at least one of the same video count, the same audio count, the same subtitle count, the same data broadcast count, the same genre, the same billing information, and the same presence or absence of the viewing restriction as the plurality of programs broadcast by the selected broadcast station.

20. The station selection method of claim 13, wherein the same broadcast station determination step performs a same broadcast station determination when the reception deterioration state is detected, when a broadcast station not included in the broadcast station information stored in the broadcast station information storage step is newly received, when a station selection parameter or a broadcast schedule included in the broadcast station information stored in the broadcast station information storage step is updated, or when a predetermined interval has elapsed from a time at which the same station determination was last performed.

21. The station selection method of claim 13, wherein the same broadcast station determination step generates or updates the broadcast station information when it has performed the same broadcast station determination or has performed the same broadcast station determination a predetermined number of times.

22. The station selection method of claim 13, wherein:
the same broadcast station information indicates a plurality of broadcast stations determined to be the same broadcast station; and
when deterioration of the reception state of the received signal is detected, the station selection control step controls the broadcast receiving step so as to switch the broadcast station selection over to a broadcast station in the plurality of broadcast stations indicated by the same broadcast station information sequentially in a priority order, starting from high priority.

23. The station selection method of claim 13, wherein when the same broadcast station determination step cannot detect a broadcast station determinable to be the same broadcast station, the station selection control step controls the broadcast receiving step, searches all frequency bands in order, and detects a receivable broadcast station.

24. The station selection method of claim 13, wherein the digital broadcast receiving method has a plurality of broadcast receiving steps, and the station selection control step:
- causes one broadcast receiving step among the plurality of broadcast receiving steps to separate the video data and the audio data broadcast by the selected broadcast station; and
- controls another broadcast receiving step among the plurality of broadcast receiving steps by causing the another broadcast receiving step to search all frequency bands in order and separate program information including information related to broadcast programs from the digital signal, and updates the broadcast station information on a basis of the separated program information.

* * * * *